(12) United States Patent
Wang

(10) Patent No.: US 7,626,864 B2
(45) Date of Patent: Dec. 1, 2009

(54) ELECTRICALLY ALTERABLE NON-VOLATILE MEMORY CELLS AND ARRAYS

(76) Inventor: Chih-Hsin Wang, 6585 Gillis Dr., San Jose, CA (US) 95120

( * ) Notice: Subject to any disclaimer, the term of this patent is extended or adjusted under 35 U.S.C. 154(b) by 344 days.

(21) Appl. No.: 11/380,418

(22) Filed: Apr. 26, 2006

(65) Prior Publication Data

US 2007/0253257 A1 Nov. 1, 2007

(51) Int. Cl.
*G11C 11/34* (2006.01)
*H01L 29/788* (2006.01)

(52) U.S. Cl. .............. 365/185.18; 365/185.19; 365/185.28; 257/315; 257/318; 257/321; 257/E29.306; 257/E29.309; 257/E21.682; 257/E21.689

(58) Field of Classification Search ........... 365/185.18, 365/185.19, 185.28; 257/315, 318, 321
See application file for complete search history.

(56) References Cited

U.S. PATENT DOCUMENTS

| | | | |
|---|---|---|---|
| 4,698,787 A | 10/1987 | Mukherjee et al. | |
| 4,816,883 A | 3/1989 | Baldi | |
| 4,957,877 A | 9/1990 | Tam et al. | |
| 5,029,130 A | 7/1991 | Yeh | |
| 5,106,772 A | 4/1992 | Lai | |
| 5,465,231 A | 11/1995 | Ohsaki | |
| 5,604,700 A | 2/1997 | Parris et al. | |
| 5,736,764 A | 4/1998 | Chang | |
| 5,792,670 A | 8/1998 | Pio et al. | |
| 5,822,242 A | 10/1998 | Chen | |
| 5,838,617 A | 11/1998 | Bude et al. | |
| 5,877,524 A | 3/1999 | Oonakado et al. | |
| 5,966,329 A | 10/1999 | Hsu et al. | |
| 6,144,581 A | 11/2000 | Diorio et al. | |
| 6,172,397 B1 | 1/2001 | Oonakado et al. | |
| 6,348,711 B1 | 2/2002 | Eitan | |
| 6,509,603 B2 | 1/2003 | Lin et al. | |
| 6,617,637 B1 | 9/2003 | Hsu et al. | |
| 6,631,087 B2 | 10/2003 | Di Pede et al. | |
| 6,639,835 B2 | 10/2003 | Forbes | |
| 6,680,505 B2 | 1/2004 | Ohba et al. | |

(Continued)

OTHER PUBLICATIONS

Nishida at al, "Oxide field and thickness dependence of trap generation in 9-30 nm dry and dry/wet/dry oxides", J. Appl. Phys., vol. 69, pp. 3986-3994, 1991.

(Continued)

*Primary Examiner*—Dao H Nguyen

(57) ABSTRACT

Nonvolatile memory cells and array are provided. The memory cell comprises a body, a source, a drain, and a charge storage region. The body comprises an n-type conductivity and is formed in a well of the n-type conductivity. The source and the drain have p-type conductivity and are formed in the well with a channel of the body defined therebetween. The charge storage region is disposed over and insulated from the channel by a channel insulator. Each cell further comprises a bias setting having a source voltage applied to the source, a well voltage applied to the well, and a drain voltage applied to the drain. A bias configuration for an erase operation of the memory cell is further provided, wherein the source voltage is sufficiently more negative with respect to the well voltage and is sufficiently more positive with respect to the drain voltage to inject hot holes onto the charge storage region. The cells can be arranged in row and column to form memory arrays and memory device.

16 Claims, 14 Drawing Sheets

U.S. PATENT DOCUMENTS

| | | |
|---|---|---|
| 6,730,960 B2 | 5/2004 | Forbes |
| 6,791,883 B2 | 9/2004 | Swift et al. |
| 6,876,033 B2 | 4/2005 | Cappelletti et al. |
| 6,882,574 B2 | 4/2005 | Yang et al. |
| 6,885,587 B2 | 4/2005 | Yang et al. |
| 6,906,953 B2 | 6/2005 | Forbes |
| 6,934,193 B2 | 8/2005 | Lee |
| 7,133,313 B2 * | 11/2006 | Shih .................. 365/185.18 |
| 2007/0117323 A1 * | 5/2007 | Yeh ........................ 438/261 |

OTHER PUBLICATIONS

C. Diorio, "A p-Channel MOS Synapse Transistor with Self-Convergent memory Writes", IEEE Trans. on Electron Devices, vol. 47, pp. 464-472, 2000.

* cited by examiner (ERASE)

ELECTRICALLY ALTERABLE NON-VOLATILE MEMORY CELLS AND ARRAYS

RELATED APPLICATIONS

Cross-reference is made to U.S. patent application Ser. No. 10/962,288 filed on Oct. 8, 2004 and to U.S. patent application Ser. No. 10/919,555 filed on Aug. 16, 2004.

TECHNICAL FIELD

The present invention deals with non-volatile memory, and relates more specifically to Electrically Programmable Read Only Memories (EPROM) and Electrically Erasable and Programmable Read Only Memories (EEPROM). More particularly, the present invention relates to memory cell structure and method altering charge state of memory cells by employing mechanism injecting holes onto floating gate or charge storage sites of non-volatile memory cells for erase operation.

BACKGROUND OF THE INVENTION

Non-volatile semiconductor memory cells using a charge storage region to store charges and memory arrays of such non-volatile memory cells in a semiconductor substrate are well known in the art. The charge storage region or charge storage sites are electrically insulated from and capacitively coupled to surrounding electrodes through surrounding insulators. Typically, the memory cell state is altered by introducing electron charges onto the charge storage region in a program operation or by removing electron charges off the charge storage region in an erase operation. The amounts of charges retained in the charge storage region define the states of a memory cell. Typically, the states thus defined can be either two levels or more than two levels (for multi-level states storage). The memory cell of such memory cells have been of the single-gate type, split gate type, or stacked gate type, or a combination thereof.

Well-known mechanisms such as channel hot electron injection (CHEI), source-side injection (SSI), Fowler-Nordheim tunneling (FN), impacted channel hot electrons (ICHE), and Band-to-Band Tunneling (BTBT) induced hot electron injection can be used to alter the states of such cells in program operation. Examples on employing such mechanisms for memory operations can be seen in U.S. Pat. Nos. 4,698,787, 5,029,130, 5,792,670, 6,144,581 and 5,966,329 for CHEI, SSI, FN, ICHE, and BTBT mechanisms, respectively.

For re-programmability, the cells need be erased by performing the erase operation. All the cells in the patents mentioned above are erased by using Fowler-Nordheim tunneling mechanism. Similar technique has been widely employed in other types of memory cells (for example, U.S. Pat. Nos. 6,631,087, 5,604,700, and 5,465,231).

The present invention can best be understood with an understanding of how the memory cells in prior art are constructed and how they are operated for erase operation. Thus a short introduction is presented to describe the prior art cell structures and the cell operations.

FIG. 1A illustrates a cross sectional view for a portion of cell structure 100a of the prior arts. The cell 100a comprises a floating gate (FG) 14, a body 16, a source 18, and a drain 20 with a channel 22 of the body 16 defined therebetween. Both the source 18 and the drain 20 are assumed of n-type conductivity. The body 16 is assumed of p-type conductivity and is in a well 24 of same conductivity ("p-Well"). FG 14 is disposed over and insulated from the channel 22 by a layer of storage insulator 26. There are shown electrons 30 stored on FG 14 to represent the cell in the programmed state.

The erase operation on prior arts cell is done by utilizing Fowler-Nordheim tunneling mechanism to remove electrons 30 off FG 14 typically along one of the trajectories shown in dotted-lines 32a, 32b, and 32c. The trajectories 32a and 32b show electrons 30 transporting to the source 18 and to the channel 22, respectively. The electrons can be removed along trajectory 32c if adding a tunneling capacitor 28 to the cell 100a. Proper voltages and bias polarity are applied to the cell for the erase operation. For example, to remove electrons 30 along the trajectory 32c, the voltage $V_{TUN}$ at tunneling capacitor 28 is sufficiently positive with respect to the voltages at the source ($V_S$), drain ($V_D$) or body ($V_B$).

FIG. 1B illustrates a cross sectional view for another cell structure 100b of the prior arts. The cell 100b is identical in all respects except one the same as that of FIG. 1A. The difference is that an additional element of control gate 34 is disposed over and insulated from the FG 14 by a coupling insulator 36. The erase operation of this cell is done by utilizing Fowler-Nordheim tunneling to remove electrons 30 off FG 14 along one or all of the trajectories shown in dotted-lines 32a, and 32b. Proper voltages and bias polarity are applied to the cell. For example, to remove electrons 30 along the trajectory 32a and 32b, the voltage $V_{CG}$ at control gate 34 is sufficiently negative with respect to $V_S$, $V_D$ or $V_B$. Typical voltages for erasing the memory cell are: $V_{CG}=-10V$, $V_S=+10V$, and $V_B=+10V$. The drain 20 is left open during the erase operation.

In erasing these types of memory cells with Fowler-Nordheim tunneling mechanism, a high voltage (typically ranging from 9 to 20V) is required to perform the operation in order to set a desired logic states (e.g. a "0" state) to the cells. To support the memory cell operation, infrastructure for on-chip high voltage generation is thus essential and has become an essential block in memories and products. The infrastructure involves separate sets of transistors used for handling high voltages and typically required adding at least 5 extra masks to a conventional CMOS technology. Therefore, it complicates process technology for manufacturing the memories. Further, the FN mechanism unavoidably introduces stress field in the range of about 10 MV/cm to the surrounding insulator, and results in charge leakage and retention failure even when memory cells are under a low field condition. It is believed that the high voltage demands stringent control on the quality of the surrounding insulators. The memories operated under the mechanism thus are vulnerable to manufacturing and reliability problems.

U.S. Pat. No. 6,348,711 taught an EEPROM memory cell structure and operation method. The cell is erased by injecting holes into the floating gate using Band-to-Band Tunneling (BTBT) mechanism. Similar technique has been widely employed in other types of memory cells (for example, U.S. Pat. Nos. 6,617,637, 6,906,953 and 6,934,193). Such erase method is believe suffered from the problems of low injection efficiency (Here, the term "injection efficiency" is defined as the ratio of the number of charge carriers entering into FG to the number of charge carriers supplied by the source).

The erase operation for cells 100a and 100b can alternately be performed by removing electrons via non-electrical means, such as application of ultraviolet (UV) light treatment to memory cells. Examples on UV treatment can be seen in U.S. Pat. Nos. 6,882,574 and 6,885,587. One of the major problems for UV treatment is that the erase operation requires erasure of the entire memory device by application of UV light even erase is made for changing the content of only a single byte. The memory device has to be removed from the circuit board in order to perform UV treatment for the erase operation. The process is tedious and adds inconvenience in product applications.

The present invention solves these problems by providing cell structure and operation methods. The erase operation of the present cell permits the voltage drop across the storage insulator be confined in range less than about 3 V. Therefore, it avoids the high field stress on the insulator and hence the reliability problem. Other advantages, objects and features of the present invention will become apparent by a review of the specification, claims and appended figures.

DISCLOSURE OF THE INVENTION

It is the object of the invention to provide an improved electrically alterable memory cell and operation methods.

Briefly, a preferred embodiment of the present invention is an electrically erasable and programmable nonvolatile memory device including at least one memory cell. Each memory cell comprises a body of an n-type conductivity in a well of the n-type conductivity, a source and a drain of a p-type conductivity formed in the well with a channel of the body defined therebetween, a charge storage region disposed over and insulated from the channel by a channel insulator, a bias setting including a source voltage applied to the source, a well voltage applied to the well, and a drain voltage applied to the drain, and a bias configuration for an erase operation of the memory cell, wherein the source voltage is sufficiently more negative with respect to the well voltage and is sufficiently more positive with respect to the drain voltage to inject hot holes onto the charge storage region.

Briefly, another preferred embodiment of the present invention is an electrically erasable and programmable nonvolatile memory device including at least one memory cell. Each memory cell comprises a storage transistor, a select transistor, a bias setting and a bias configuration for an erase operation of the memory cell. The storage transistor comprises a body of an n-type conductivity in a well of the n-type conductivity, a first source and a first drain of a p-type conductivity formed in the well with a first channel of the body defined therebetween, and a charge storage region disposed over and insulated from the first channel by a channel insulator. The select transistor comprises a second source and a second drain of the p-type conductivity formed in the well with a second channel defined therebetween, and a select gate disposed over and insulated from the second channel by a gate insulator, wherein the second source is electrically connected to the first drain. The bias setting comprises a source voltage applied to the first source, a well voltage applied to the well, a select-gate voltage applied to the select-gate, and a bit-line voltage applied to the second drain. The bias configuration for the erase operation of the memory cell is such that the select-gate voltage is substantially at a same voltage level or a voltage level sufficiently more negative with respect to the bit-line voltage, and the source voltage is sufficiently more negative with respect to the well voltage and is sufficiently more positive with respect to the bit-line voltage to inject hot holes onto the charge storage region.

Briefly, another preferred embodiment of the present invention is an electrically erasable and programmable nonvolatile memory device including at least one memory array. Each memory array comprises a plurality of nonvolatile memory cells arranged in a rectangular array of rows and columns. Each of the plurality of nonvolatile memory cells comprises a body of an n-type conductivity in a well of the n-type conductivity, a source and a drain of a p-type conductivity formed in the well with a channel of the body defined therebetween, a charge storage region disposed over and insulated from the channel by a channel insulator, a bias setting and a bias configuration for an erase operation of the memory cell. The bias setting comprises a source voltage applied to the source, a well voltage applied to the well, and a drain voltage applied to the drain. The bias configuration for the erase operation of the memory cell is such that the source voltage is sufficiently more negative with respect to the well voltage and is sufficiently more positive with respect to the drain voltage to inject hot holes onto the charge storage region.

These and other objects and advantages of the present invention will become clear to those skilled in the art in view of the description of the preferred embodiment as described herein and as illustrated in the figures of the drawings.

BRIEF DESCRIPTION OF THE DRAWINGS

The invention is herein described, by ways of example only, with reference to accompanying drawings, wherein FIG. 1A (prior art) is a cross sectional view illustrating the memory cell architecture of the prior arts, and further illustrating the trajectories of the electrons movements in the erase operation.

DETAILED DESCRIPTION OF THE INVENTION

Embodiments of the present invention described in the following detailed description are directed at memory cell structures and operation methods. Those of ordinary skill in the art will realize that the detailed description is illustrative only and is not intended to restrict the scope of the claimed inventions in any way. Other embodiments of the present invention, beyond those embodiments described in the detailed descriptions, will readily suggest themselves to those of ordinary skill in the art having the benefit of this disclosure. Reference will now be made in detail to implementations of the present invention as illustrated in the accompanying drawings. Where appropriate, the same reference indicators will be used throughout the drawings and the following detailed description to refer to the same or similar parts.

As used herein, the symbol p+ indicates a heavily doped semiconductor material of p-type conductivity typically having a doping level of p-type impurities (e.g. Boron) on the order of $10^{18}$ to $10^{20}$ atoms/cm$^3$. The symbol p− indicates a lightly doped semiconductor material of p-type conductivity typically having a doping level on the order of $10^{16}$ to $10^{18}$ atoms/cm$^3$ for p− doped wells and on the order of $10^{15}$ atoms/cm$^3$ for p− substrate material (p-sub). The symbol n+ indicates a heavily doped semiconductor material of n-type conductivity typically having a doping level of n-type impurities (e.g. Arsenic) on the order of $10^{18}$ to $10^{20}$ atoms/cm$^3$. The symbol n− indicates a lightly doped semiconductor material of n-type conductivity typically having a doping level on the order of $10^{16}$ to $10^{18}$ atoms/cm$^3$ for n-doped wells (n-Wells) and on the order of $10^{15}$ atoms/cm$^3$ for n-substrate material. Those of ordinary skill in the art will now also realize that a range of doping concentrations around those described is suitable for the present purposes. Essentially, any process capable of forming memory cells is suitable for the present purposes. Doped regions may be formed by thermal diffusion or by ion implantation. When it is written that something is doped at approximately the same level as something else, the doping levels are within approximately a factor of ten of each other.

The Memory Cells of the Present Invention

Figure 2A:
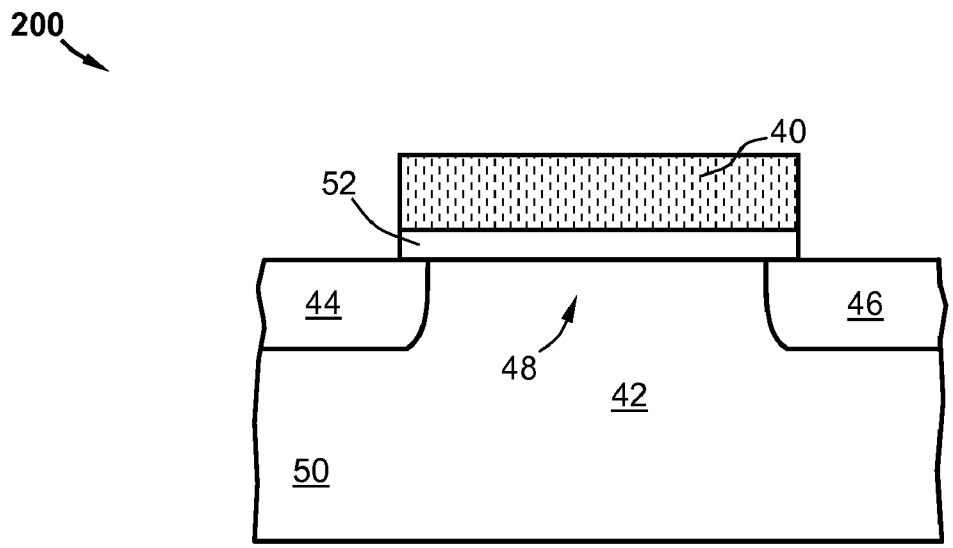
FIG. 2A is a cross-sectional view of a memory cell in accordance with one embodiment of the present invention.

FIG. 2A illustrates a memory cell 200 in accordance with one embodiment of the present invention. The cell 200 is a p-channel based memory cell, and comprises a body 42 of an n-type conductivity in a well 50 of the n-type conductivity (n-Well 50), a source 44 and a drain 46 of a p-type conductivity formed in the n-Well 50 with a channel 48 of the body 42 defined therebetween, and a charge storage region (CSR 40) disposed over and insulated from the channel 48 by a channel insulator 52 having a thickness in the range of about 50 Å to 200 Å.

The source 44 and the drain 46 typically have a doping level in the range of about $5 \times 10^{18}$ atoms/cm$^3$ to about $5 \times 10^{21}$ atoms/cm$^3$.

CSR 40 may comprise n+ polycrystalline silicon ("polysilicon") material, p+ polysilicon material, n+ or p+ polycrystalline silicon-germanium ("poly SiGe"), metal, such as aluminum (Al), platinum (Pt), gold (Au), titanium (Ti), Tungsten (W), Molybdenum (Mo), ruthenium (Ru), tantalum (Ta), nickel (Ni), cobalt (Co), tantalum nitride (TaN), titanium nitride (TiN) etc, or any alloy thereof, or can be silicide, such as platinum-silicide (PtSi), titanium-silicide (TiSi), tungsten-silicide (WSi), nickel-silicide (NiSi), cobalt-silicide (CoSi) etc. or any other suitable material used for charge storage.

The n-Well 50 can be formed in a p-type silicon substrate (hereinafter "p-sub") having a doping level at about $1 \times 10^{15}$ atoms/cm$^3$. Alternately, the n-Well 50 can be formed in and isolated from an n-type silicon substrate (hereinafter "n-sub") by a well of p-type conductivity (hereinafter "p-Well"). Additionally, the n-Well 50 can be formed in a silicon-on-insulator substrate. The n-Well 50 can have a doping level in the range between about $1 \times 10^{16}$ atoms/cm$^3$ to about $1 \times 10^{18}$ atoms/cm$^3$.

The CSR 40, body 42, source 44, drain 46, channel 48, and insulator 52 also construct a storage transistor providing capability on altering, storing and sensing electric charges on CSR 40.

Erase Operation

Figure 2B:
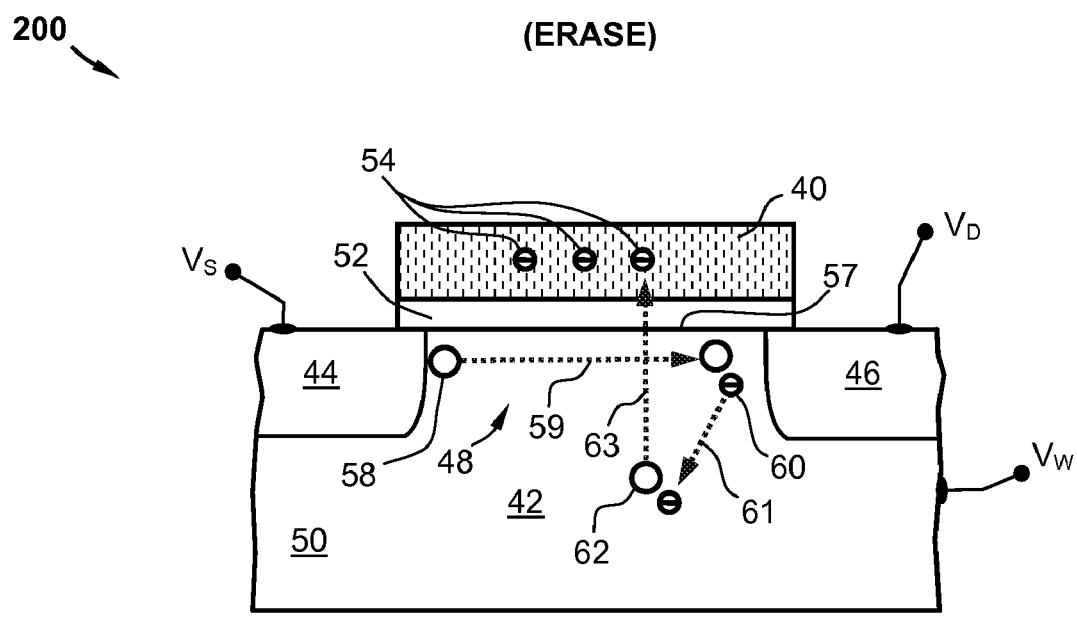
FIG. 2B is a cross sectional view illustrating the memory cell of FIG. 2A, and further illustrating the trajectories of holes and electrons movements in the erase operation in accordance with the present invention.

The key aspect of the present invention lies in the manner in which the memory cell is erased. Rather than erasing memory cell with methods in the prior art (e.g. Fowler-Nordheim mechanism or with BTBT mechanism), the cell of present invention is erased by employing the Secondary Substrate Hot Hole Injection (SSHHI) mechanism. FIG. 2B shows a cross sectional view illustrating SSHHI for the erase operation of the present invention. Referring to FIG. 2B, there is shown cell 200 biased with a source voltage $V_S$ to the source 44, a drain voltage $V_D$ to the drain 46, and a well voltage $V_W$ to the body 42 through n-Well 50. The CSR 40 is shown negatively charged with electrons 54 to represent the cell 200 initially in a program state. The CSR 40 is sufficiently negatively charged to form hole charge carriers ("holes") 58 in the channel 48. The cell 200 is erased by setting a bias configuration such that $V_S$ is sufficiently more negative with respect to $V_W$ and is sufficiently more positive with respect to $V_D$. Such bias configuration generates a lateral electric field along the channel 48 and a vertical electric field in the body 42. Such vertical field is substantially vertical to a channel surface 57. The lateral electric field accelerates holes 58 to transport along a first trajectory 59 to generate impacted electrons 60. The impacted electrons 60 are accelerated along a second trajectory 61 to generate secondary holes 62 in the body 42. A portion of the secondary holes 62 are accelerated by the vertical electrical field in the body 42 to transport along a third trajectory 63 generally perpendicular to the channel surface 57 toward CSR 40. Some of them gain enough energy to surmount a hole barrier height $\Phi_{VB}$ between the insulator 52 and the body 42, making their way entering and injected onto CSR 40 to neutralize electrons 54 reside thereon, thus erasing the cell. Typical voltages for erasing the memory cell are: $V_S$=0V, $V_W$=3.3V, and $V_D$=−3.3V. For maximizing the efficiency of the SSHHI mechanism, it is desirable to maintain the voltage of CSR ($V_{CSR}$) at a level that is sufficiently lower than the source voltage of the cell 200. For example, $V_{CSR}$ can be set at −3.3V for the case where $V_S$=0V.

The present invention provides a cell structure and an erase method that can align the direction of the acceleration field to the direction transporting the injected charge carriers. In other words, holes 62 in FIG. 2B are "aimed" directly at CSR 40 while being accelerated in the vertical electric field in body 42. Therefore, the injection efficiency can be much higher than that of the prior art method such as BTBT.

Figure 3:
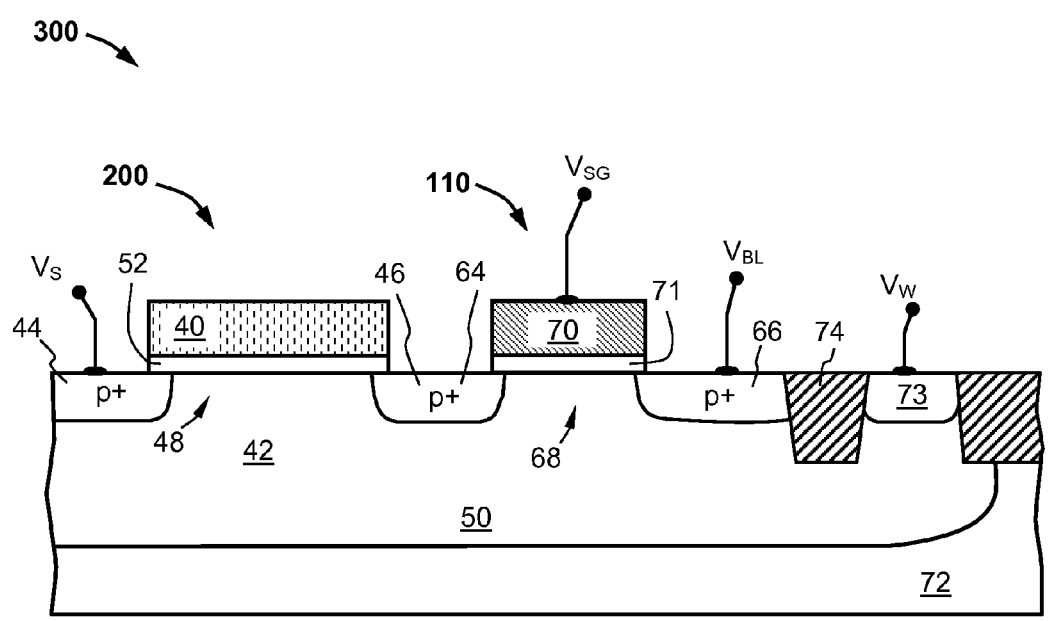
FIG. 3 is a cross-sectional view of a memory cell in accordance with another embodiment of the present invention.

FIG. 3 illustrates a memory cell 300 in accordance with another embodiment of the present invention. The cell 300 comprises a storage transistor of cell 200 of the FIG. 2A type in an n-Well 50 and a select transistor 110 having a source 64 and a drain 66 of the p-type conductivity and formed in the n-Well 50 with a second channel 68 defined therebetween, and a select gate 70 of conductive material disposed over and insulated from the second channel 68 by a gate insulator 71, wherein the source 64 of the select transistor 110 is electrically connected to the drain 46 of the cell 200. The source 64 and drain 66 typically have approximately the same doping level as that of the source 44 and drain 46 of cell 200. The gate 70 may comprise n+ polysilicon material, p+ polysilicon material, n+ or p+ poly SiGe, metal, such as Al, Pt, Au, Ti, W, Mo, Ru, Ta, Ni, Co, TaN, TiN etc, or any alloy thereof, silicide, such as PtSi, TiSi, WSi, NiSi, CoSi, or any other suitable conductive material and any combination thereof. For example, the select gate 70 can comprise a conductive layer having a TiSi layer formed atop of an p+ polysilicon material. The n-Well 50 is formed in a p-sub 72. Also provided in FIG. 3 is an n-Well tap 73 comprising a n+ diffusion in the n-Well 50. The n-Well tap 73 functions as a tap to the n-Well 50, and is shown isolated from other regions (e.g. drain 66) typically by field oxide regions 74. The field oxide 74 is an insulator typically comprising oxide having a thickness in the range of about 1500 Å to 5000 Å.

The cell 300 is erased by employing SSHHI mechanism as described in connection with FIG. 2B. To perform the erase operation, the cell 300 is biased with a source voltage $V_S$ to the source 44 of the cell 200, a well voltage $V_W$ to the n-Well 50 through n-Well tap 73, and a drain voltage $V_D$ to the drain 46 of cell 200 through a select gate voltage $V_{SG}$ applied to the select gate and a bit-line voltage $V_{BL}$ applied to the drain 66 of the select transistor 110. The cell 300 is erased by setting a bias configuration such that $V_S$ is sufficiently more negative with respect to $V_W$ and is sufficiently more positive with respect to $V_D$. The bias configuration further comprises setting the select transistor 110 in an "ON" state to electrically connect the drain 46 of cell 200 to the drain 66 of the select transistor 110. The ON state is done by setting $V_{SG}$ at a same voltage level or a voltage level sufficiently more negative with respect the bit-line voltage $V_{BL}$. Typically, $V_{SG}$ is more negative with respect to $V_{BL}$ by about a threshold voltage $V_T$ of the select transistor 110. The bias configuration injects substrate secondary hot holes onto CSR 40 in mechanism as described in connection with FIG. 2B. An example on biases for erasing the cell is: $V_S$=0V (applied to source 44), $V_W$=+3.3V (applied to n-Well 50), $V_{BL}$=−3.3V (applied to drain 66), and $V_{SG}$=−3.8V (applied to select gate 70).

Figure 4:
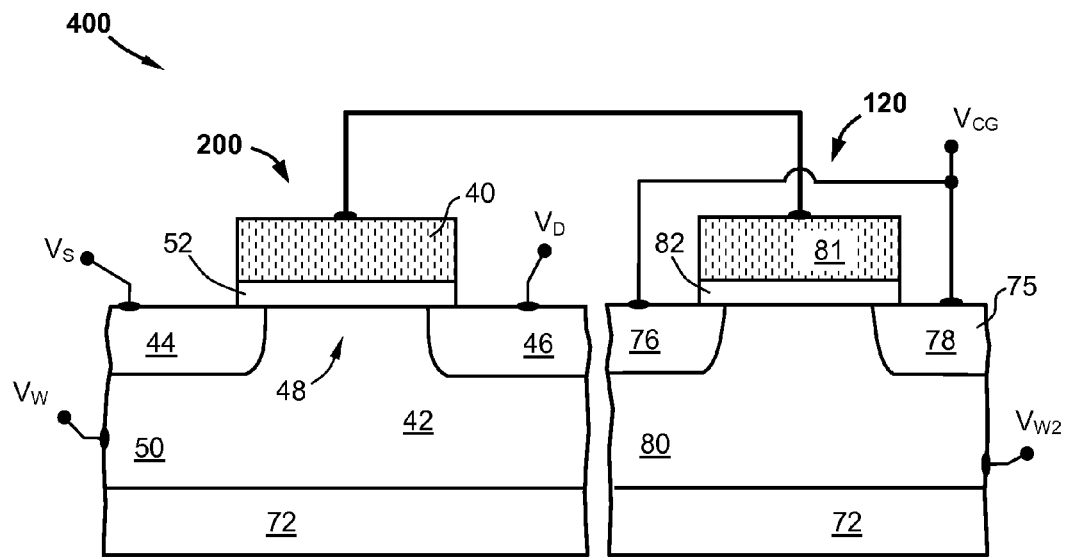
FIG. 4 is a cross-sectional view of a memory cell in accordance with another embodiment of the present invention.

FIG. 4 provides a memory cell 400 in accordance with another embodiment of the present invention. The cell 400 comprises cell 200 of the FIG. 2A type, wherein the n-Well 50 is a first n-Well 50, and a control element 120 having a control gate 75 comprising at least a diffusion of the p-type conductivity (a first diffusion 76 and a second diffusion 78) formed in a second n-Well 80, and a coupling gate 81 disposed over and insulated from the second n-Well 80 by a gate insulator 82, wherein the coupling gate 81 of the control element 120 is electrically coupled to the CSR 40 of the cell 200. The first diffusion 76 is electrically connected to the second diffusion 78 of the control element 120, and can have approximately the same level doping as that of the source 44 and drain 46 of the cell 200 described in connection with FIG. 2A. The coupling gate 81 may comprise n+ polysilicon material, p+ polysilicon material, n+ or p+ poly SiGe, metal, silicide, or any other suitable conductive material and any combination thereof. Further, the architecture of coupling gate can comprise a combination of these materials. For example, the architecture of coupling gate 81 can comprise a conductive layer having a TiSi layer formed atop of a p+ polysilicon material. The first and the second n-Wells 50 and 80 are formed in a p-sub 72 and can be connected to form one single n-Well or can be isolated to form two separate n-Wells.

The cell 400 is erased by employing SSHHI mechanism as described in connection with FIG. 2B. To perform the erase operation, the cell 400 is biased with a source voltage $V_S$ to the source 44, a drain voltage $V_D$ to the drain 46, a control gate voltage $V_{CG}$ to the control gate 75 (first and second diffusions 76 and 78), a first well voltage $V_W$ to the first n-Well 50, and a second well voltage $V_{W2}$ to the second n-Well 80. The cell 400 is erased by setting a bias configuration such that $V_S$ is sufficiently more negative with respect to $V_W$ and is sufficiently more positive with respect to $V_D$. The bias configuration further comprises setting $V_{CG}$ at a voltage sufficiently more negative with respect to $V_S$ to couple sufficient voltage onto CSR 40 so as to enhance the erase operation. The bias configuration forms holes in the channel 48 of cell 200 and injects substrate secondary hot holes onto the CSR 40 in SSHHI mechanism as described in connection with FIG. 2B. An example on biases for erasing the cell is: $V_S$=0V (applied to source 44), $V_W$=+3.3V (applied to n-Well 50), $V_D$=−3.3V (applied to drain 46), $V_{CG}$=−3.3V (applied to diffusions 76 and 78). The p-sub is typically held at a ground voltage. $V_{W2}$ can be a ground voltage, a voltage identical to $V_W$, or any other voltages that can prevent forward-biasing the metallurgical junction between n-Well 80 and p-sub 72.

One consideration in selecting the dimension of gate 81 is on the coupling effect from the control element 120 to the CSR 40. It is desirable that this dimension be minimized to maximize the coupling effect. For the discussion above, it should be clear to those of ordinary skill in the art that the teaching of the cell structure and the bias configuration described herein can be modified to adjust coupling effect from the control element 120. For example, although there are two diffusions 76 and 78 illustrated in the control element 120, in general, the control element can be simplified to contain a single diffusion. Further, although there is only one control element 120 shown in the illustration, in general, the control element can comprise a plurality of control elements connected in series. Moreover, although the first and second diffusions 76 and 78 are shown biased at same voltage ($V_{CG}$), in general, they can be biased at two separate voltages through their own terminals.

Figure 5:
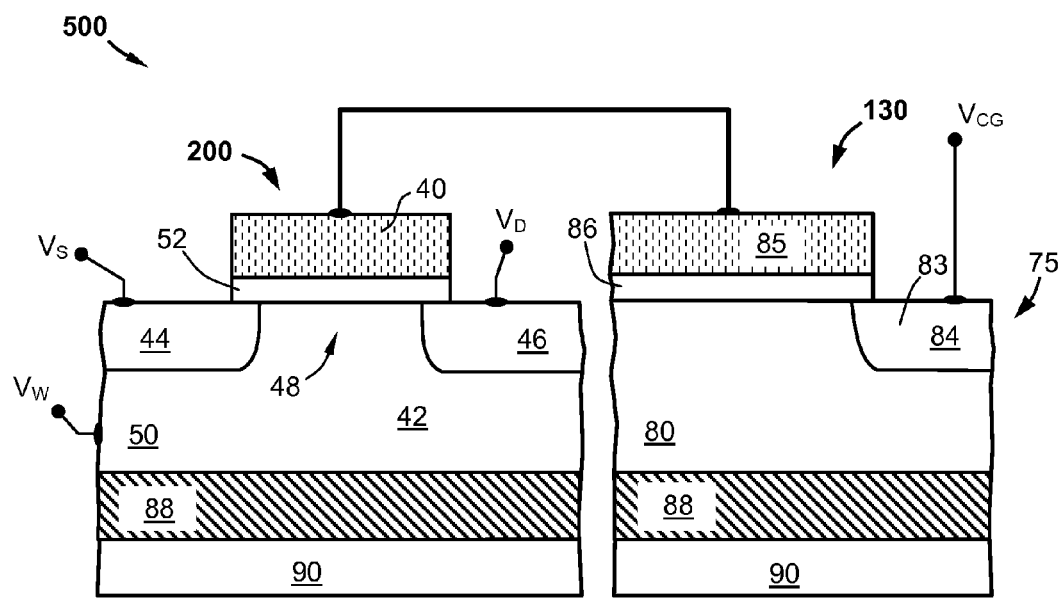
FIG. 5 is a cross-sectional view of a memory cell in accordance with another embodiment of the present invention.

FIG. 5 provides a memory cell 500 in accordance with another embodiment of the present invention. The cell 500 comprises cell 200 of the FIG. 2A type in a first Well 50 of n-type conductivity (first n-Well 50) and a coupling capacitor 130 having a control gate 75 including at least a diffusion 84 of n-type conductivity (n-diffusion 84) in a second Well 80 of n-type conductivity (second n-Well 80), and a coupling gate 85 disposed over and insulated from the second Well 80 by a coupling insulator 86, wherein the coupling gate 85 of the coupling capacitor 130 is electrically coupled to the CSR 40 of the cell 200 and having a portion thereof overlaps with an overlapping region 83 (n-diffusion 84) in the second n-Well 80. The coupling gate 85 may comprise of similar conductive material and architecture as that for gate 81 described in connection with FIG. 4. The first and the second n-Wells 50 and 80 are formed in and isolated from a silicon substrate 90 by an isolation region 88.

In a specific example, the silicon substrate is an n-sub and the isolation region 88 is a p-Well. Alternately, the silicon substrate can be a substrate of n-type conductivity or p-type conductivity and the isolation region 88 is an insulator (e.g. oxide or any other insulating material).

The diffusion 84 functions as a tap to the n-Well 80 and is with a control gate voltage $V_{CG}$ applied thereto. While not shown, $V_{CG}$ is also applied to the isolation region 88 while region 88 comprises a p-Well in the specific example above.

Figure 6:
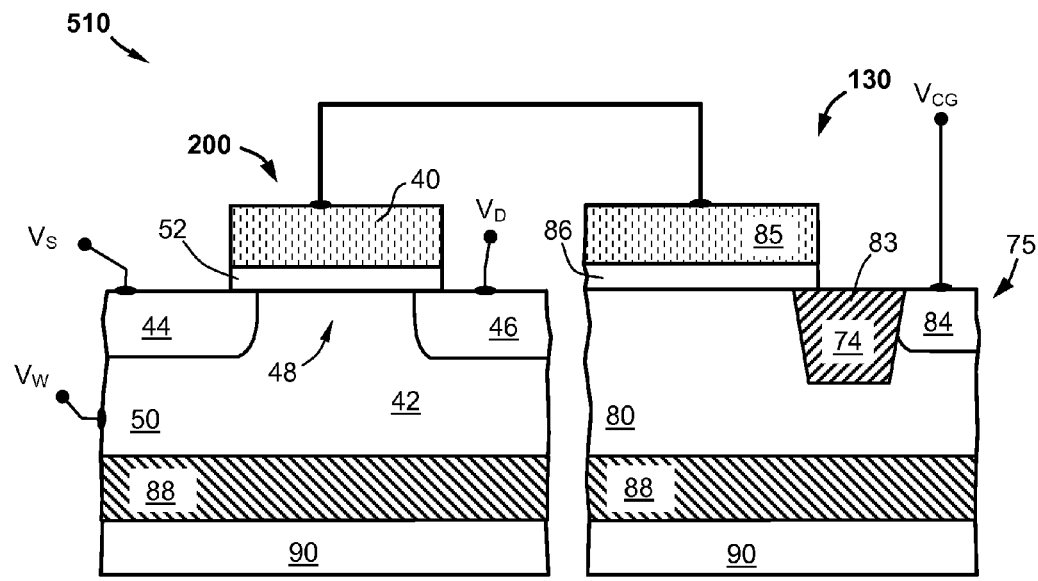
FIG. 6 is a cross-sectional view of a memory cell in accordance with another embodiment of the present invention.

FIG. 6 provides a memory cell 510 in accordance with another embodiment of the present invention. The cell 510 is in all respect except one the same as that of FIG. 5. The difference is that in the overlapping region 83 of the coupling capacitor 130, instead of having coupling gate 85 overlapping with a portion of the diffusion 84, the cell 510 is provided with coupling gate 85 overlapping with a portion of a field oxide 74.

Figure 7:
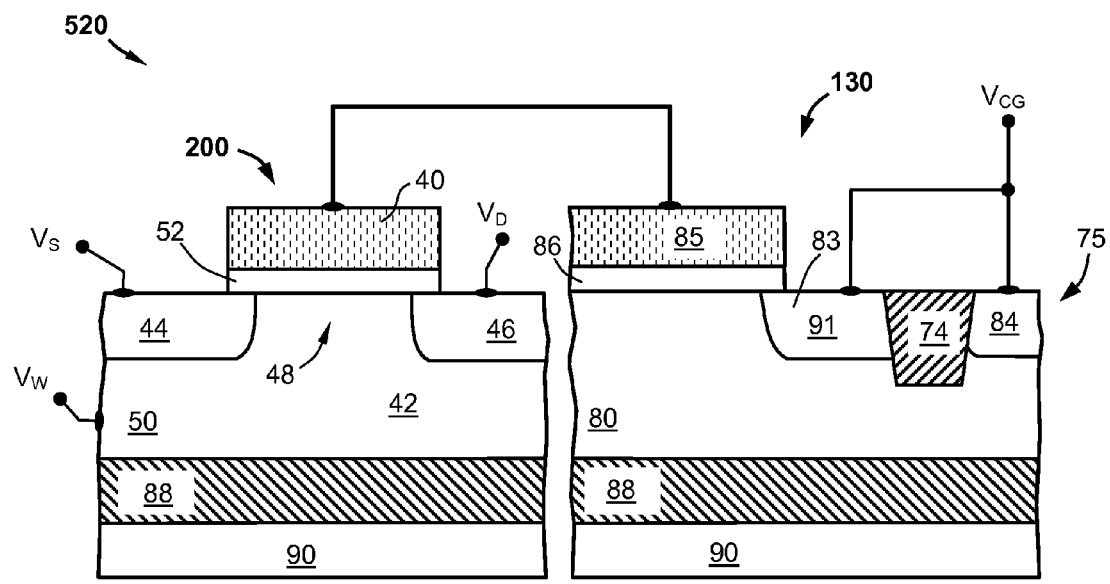
FIG. 7 is a cross-sectional view of a memory cell in accordance with another embodiment of the present invention.

FIG. 7 provides a memory cell 520 in accordance with another embodiment of the present invention. The cell 520 is in all respect except one the same as that of FIG. 5. The difference is that in the overlapping region 83 of the coupling capacitor 130, instead of having coupling gate 85 overlapping with a portion of the diffusion 84, the cell 520 is provided with coupling gate 85 overlapping with a portion of a diffusion 91 having p-type conductivity (p-diffusion). Further, there is shown the diffusion 91 electrically connected to the diffusion 84 with a control gate voltage $V_{CG}$ applied thereto.

The cells 500, 510 and 520 are erased by employing SSHHI mechanism as described in connection with FIG. 2B. To perform the erase operation, each of the cells is biased with a bias configuration such that $V_S$ is sufficiently more negative with respect to $V_W$ and is sufficiently more positive with respect to $V_D$. The bias configuration further comprises setting $V_{CG}$ at a voltage sufficiently more negative with respect to $V_S$ to couple sufficient voltage onto CSR 40 so as to enhance the erase operation. The bias configuration forms holes in the channel 48 of cell 200 and injects substrate secondary hot holes onto the CSR 40 in SSHHI mechanism as described in connection with FIG. 2B. An example on biases for erasing the cell is: $V_S$=0V (applied to source 44), $V_W$=+3.3V (applied to n-Well 50), $V_D$=−3.3V (applied to drain 46), $V_{CG}$=−3.3V (applied to the second n-Well 80). The substrate 90 is typically held at a ground voltage. While not shown, $V_{CG}$ is also applied to the isolation region 88 while region 88 comprises the p-Well as described in the specific example in connection with FIG. 5.

Figure 8:
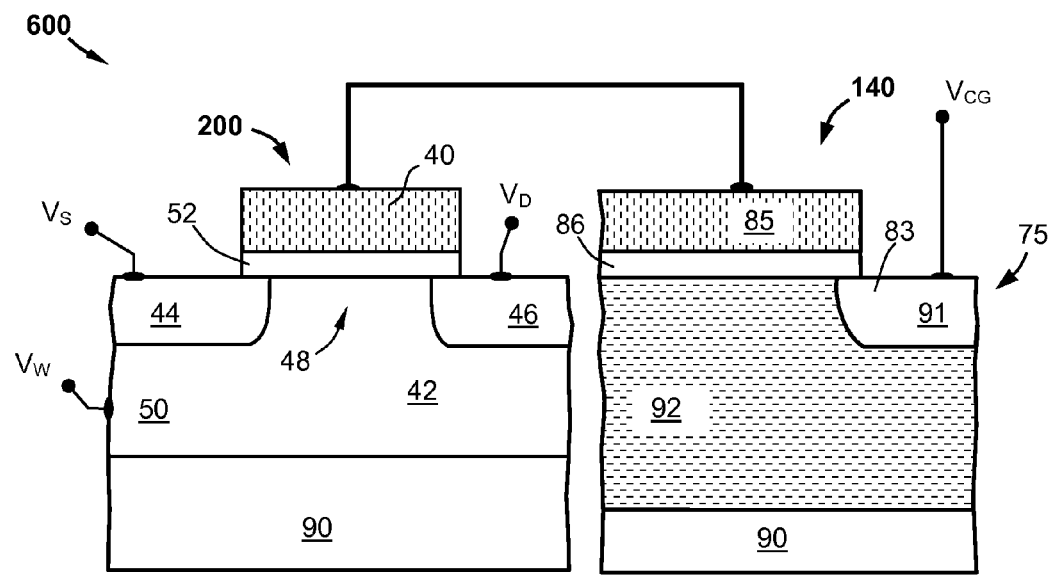
FIG. 8 is a cross-sectional view of a memory cell in accordance with another embodiment of the present invention.

FIG. 8 provides a memory cell 600 in accordance with another embodiment of the present invention. The cell 600 comprises cell 200 of the FIG. 2A type, wherein the n-Well 50 is a first Well 50, and a coupling capacitor 140 having a control gate 75 including at least a diffusion 91 of p-type conductivity in a second Well 92 of p-type conductivity, and a coupling gate 85 disposed over and insulated from the second Well 92 by a coupling insulator 86, wherein the coupling gate 85 of the coupling capacitor 140 is electrically coupled to the CSR 40 of the cell 200 and having a portion thereof overlaps with an overlapping region 83 (diffusion 91) in the second Well 92. The coupling gate 85 may comprise n+ polysilicon material, p+ polysilicon material, n+ or p+ poly SiGe, metal, or any other suitable conductive material. The first and the second Wells 50 and 92 are formed in a silicon substrate 90 of an n-type conductivity.

The diffusion 91 functions as a tap to the second Well 92 and is shown with a control gate voltage $V_{CG}$ applied thereto.

Figure 9:
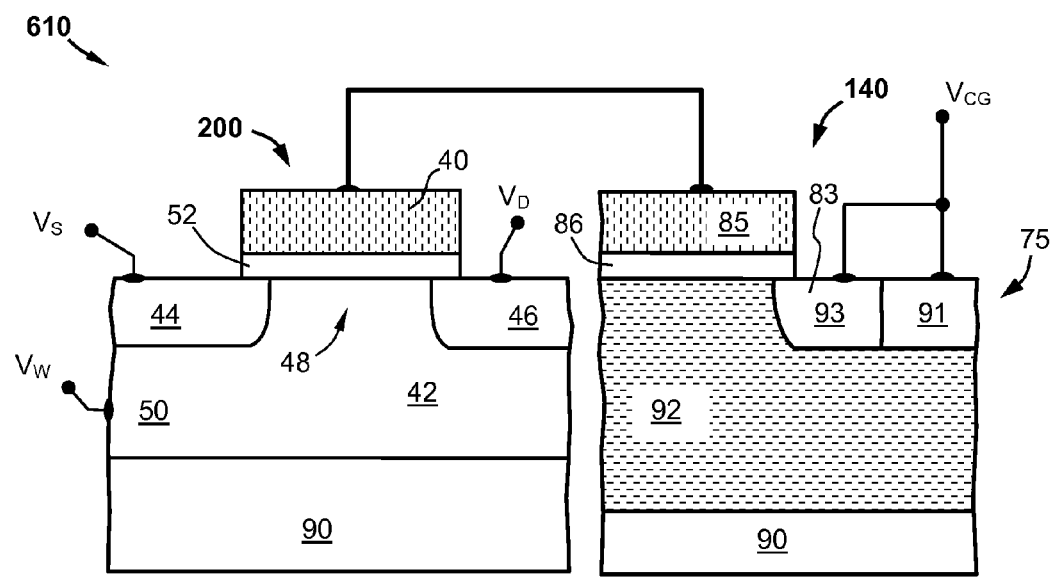
FIG. 9 is a cross-sectional view of a memory cell in accordance with another embodiment of the present invention.

FIG. 9 provides a memory cell 610 in accordance with another embodiment of the present invention. The cell 610 is in all respect except one the same as cell 600 of FIG. 8. The difference is that in the overlapping region 83 of the coupling capacitor 140, instead of having coupling gate 85 overlapping with a portion of the diffusion 91, the cell 610 is provided with coupling gate 85 overlapping with a portion of a diffusion 93 of n-type conductivity. Further, there is shown the diffusion 93 electrically connected to the diffusion 91 with a control gate voltage $V_{CG}$ applied thereto.

Figure 10:
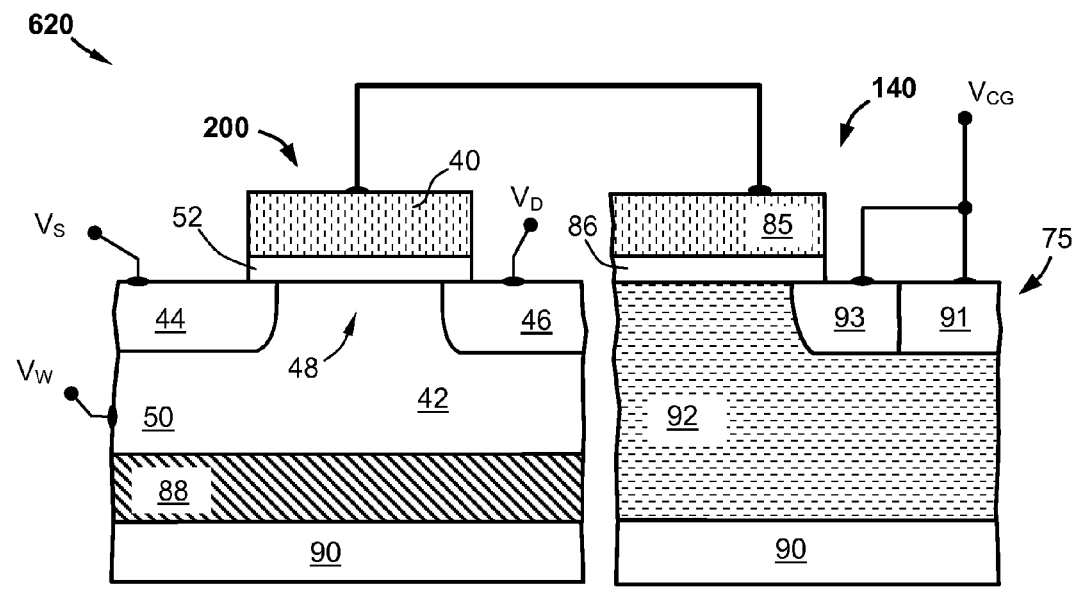
FIG. 10 is a cross-sectional view of a memory cell in accordance with another embodiment of the present invention.

FIG. 10 provides a memory cell 620 in accordance with another embodiment of the present invention. The cell 620 is in all respect except one the same as that of FIG. 9. The difference is that instead of having the first Well 50 contacting the substrate 90, the cell 620 is provided with the first Well 50 isolated from the substrate 90 by an isolation region 88. In a specific example, the isolation region 88 is a p-Well. Alternately, the isolation region 88 can be an insulator (e.g. oxide or any other insulating material).

The cells 600, 610 and 620 are erased by employing SSHHI mechanism as described in connection with FIG. 2B. To perform the erase operation, each of the cells is biased with a bias configuration such that $V_S$ is sufficiently more negative with respect to $V_W$ and is sufficiently more positive with respect to $V_D$. The bias configuration further comprises setting $V_{CG}$ at a voltage sufficiently more negative with respect to $V_S$ to couple sufficient voltage onto CSR 40 so as to enhance the erase operation. The bias configuration forms holes in the channel 48 of cell 200 and injects substrate secondary hot holes onto the CSR 40 in SSHHI mechanism as described in connection with FIG. 2B.

An example on biases for erasing the cells 600 and 610 is: $V_S$=−3.3V (applied to source 44), $V_W$=0V (applied to n-Well 50), $V_D$=−7V (applied to drain 46), $V_{CG}$=−7V. An example on biases for erasing the cells 620 is: $V_S$=0V (applied to source 44), $V_W$=+3.3V (applied to n-Well 50), $V_D$=−3.3V (applied to drain 46), $V_{CG}$=−3.3V (applied to control gate 75). The substrate 90 is typically held at a ground voltage. The isolation region 88 of cell 620 is held at a ground voltage while region 88 comprises the p-Well as described in the specific example in connection with FIG. 10.

It is noted that electrical connections are made through a connector of a conductive material to connect various diffusions in cells of the present invention. Such diffusions are, for example, diffusions 76 and 78 of cell 400 (FIG. 4), diffusions 91 and 84 of cell 520 (FIG. 7), and diffusions 93 and 91 of cells 610 and 620 (FIGS. 9 and 10). Typically, such connector can be metal wirings or local interconnect and can comprise metal, such as Al, copper (Cu), Pt, Au, Ti, W, Mo, Ru, Ta, Ni, Co, TaN, TiN etc., or any alloy thereof. Alternately, the connector can be a silicide layer typically formed in a self-aligned way to the diffusions using self-aligned-silicide technique. The connector thus can further comprise silicide, such as PtSi, TiSi, WSi, NiSi, and CoSi etc.

Figure 11:
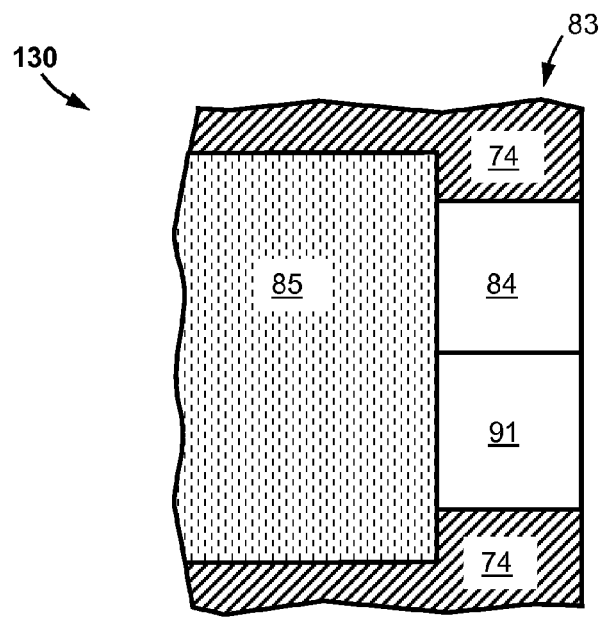
FIG. 11 is a top view illustrating the layout of the coupling capacitor and various materials for the overlapping regions in accordance with the present invention.

While the overlapping region 83 of the coupling capacitors 130 of FIG. 5 type and 140 of FIG. 8 type is shown comprised of one type of material selected from the group consisting of n-diffusion, p-diffusion, field oxide, such showing is only by way of example, and the overlapping region can readily comprise more than one or any combination of these materials. Please refer to FIG. 11 for an example on such illustration. FIG. 11 shows a top view on a portion of the layout for the coupling capacitor 130 of the present invention. The layout of the coupling capacitor 130 comprises the coupling gate 85, and the overlapping region 83 comprises n-diffusion 84, p-diffusion 91, and field oxide 74.

Figure 12:
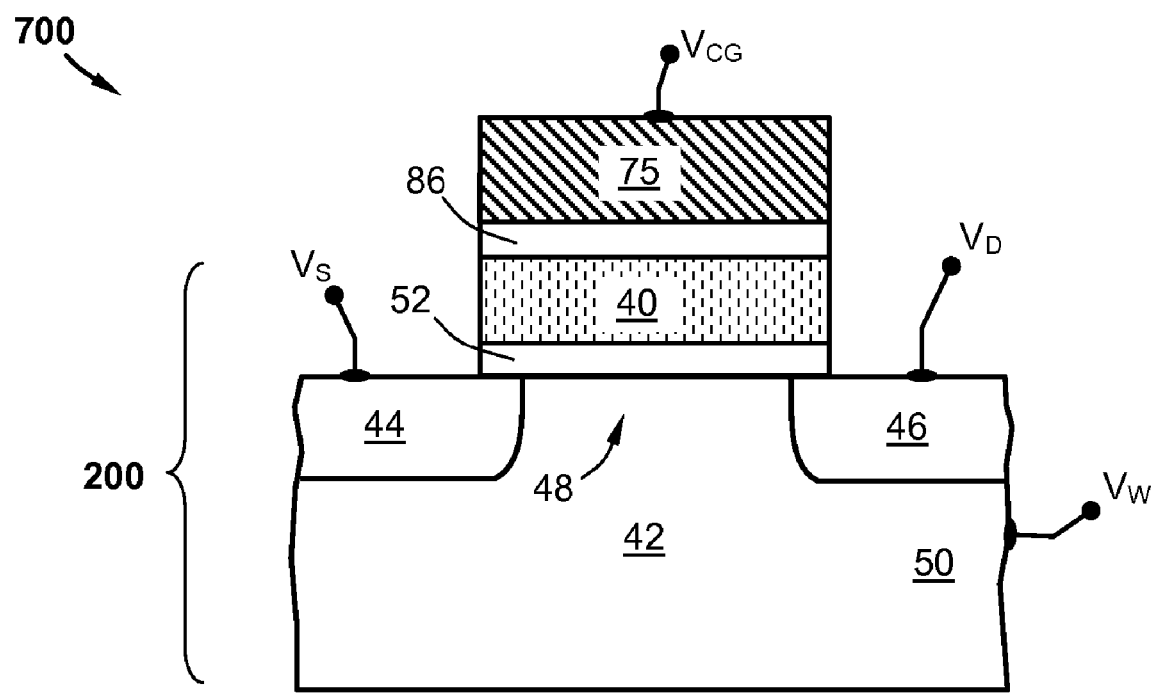
FIG. 12 is a cross-sectional view of a memory cell in accordance with another embodiment of the present invention.

FIG. 12 provides a memory cell 700 in accordance with another embodiment of the present invention. The cell 700 comprises cell 200 of the FIG. 2A type having a charge storage region (CSR) 40, a body 42 of an n-type conductivity, a source 44 and a drain 46 of the p-type conductivity with a channel 48 of the body 42 in a well of the n-type conductivity (n-Well 50) defined therebetween, and a control gate 75 of conductive material disposed over and insulated from the CSR 40 by a coupling insulator 86. The control gate 75 may comprise n+ polysilicon material, p+ polysilicon material, n+ or p+ poly SiGe, metal, such as Al, Pt, Au, Ti, W, Mo, Ru, Ta, Ni, Co, TaN, TiN etc, or any alloy thereof, silicide, such as PtSi, TiSi, WSi, NiSi, CoSi, or any other suitable conductive material and any combination thereof. For example, the control gate can comprise a conductive layer having a WSi layer formed atop of an n+ polysilicon material.

The cell 700 are erased by employing SSHHI mechanism as described in connection with FIG. 2B. To perform the erase operation, the cell is biased with a bias configuration such that $V_S$ is sufficiently more negative with respect to $V_W$ and is sufficiently more positive with respect to $V_D$. The bias configuration further comprises setting $V_{CG}$ at a voltage sufficiently more negative with respect to $V_S$ to couple sufficient voltage onto CSR 40 so as to enhance the erase operation. The bias configuration forms holes in the channel 48 of cell 700 and injects substrate secondary hot holes onto the CSR 40 in SSHHI mechanism as described in connection with FIG. 2B.

An example on biases for erasing the cell 700 is: $V_S$=0V (applied to source 44), $V_W$=+3.3V (applied to n-Well 50), $V_D$=−3.3V (applied to drain 46), $V_{CG}$=−3.3V (applied to control gate 75).

The channel insulator 52 and the coupling insulator 86 of memory cells in accordance with the present invention can comprise dielectric material such as oxide, nitride, oxynitride ("SiON"). Additionally, dielectrics having dielectric constant (or permittivity) k higher than that of oxide ("High-k dielectrics") can also be considered as the material for the insulator 86. Such High-k dielectrics can be aluminum oxide ("$Al_2O_3$"), hafnium oxide ("$HfO_2$"), titanium oxide ("$TiO_2$"), zirconium oxide ("$ZrO_2$"), tantalum pen-oxide ("$Ta_2O_5$") etc. Furthermore, any composition of these dielectrics and any alloy formed thereof, such as hafnium oxide-oxide alloy ("$HfO_2$—$SiO_2$"), hafnium-aluminum-oxide alloy ("HfAlO"), hafnium-oxynitride alloy ("HfSiON") etc. can be used for the insulator. Moreover, insulator 86 need not be of dielectric materials having a uniform chemical element and need not comprising single layer, but rather can be dielectric materials having graded composition on its element, and can comprise more than one layer. For example, the coupling insulator 86 can comprise an insulating layer having a first oxide layer, a nitride layer, and a second oxide layer with the nitride layer disposed therebetween.

Program Operation

Figure 13:
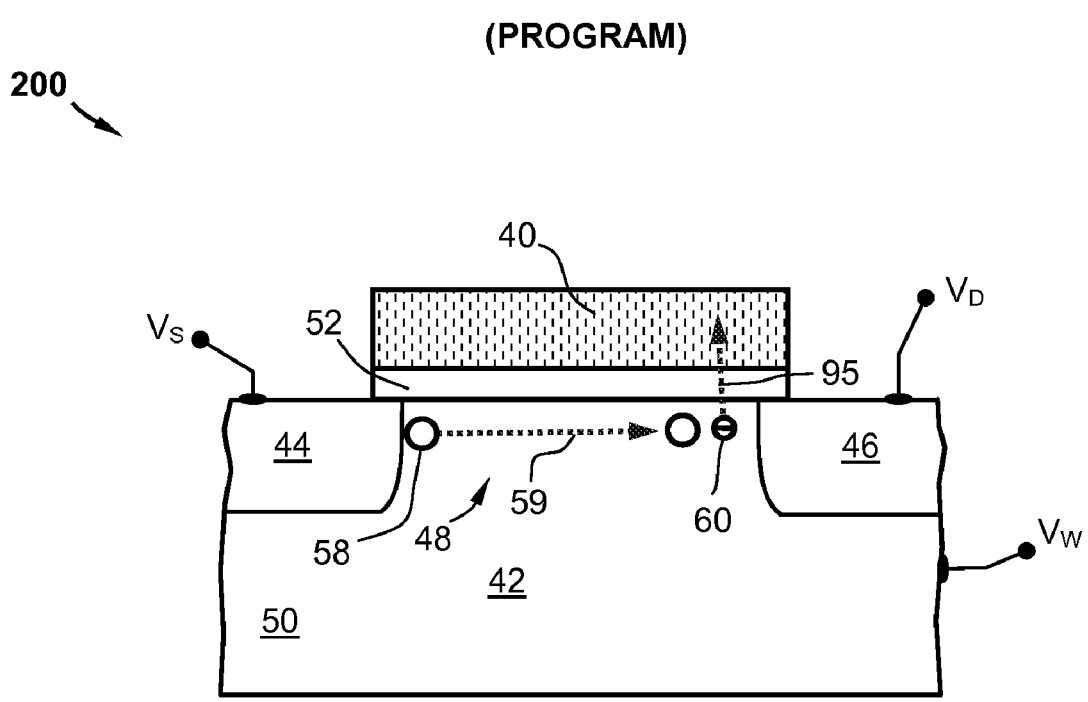
FIG. 13 is a cross sectional view illustrating the memory cell of FIG. 2A, and further illustrating the trajectories of holes and electrons movements in a program operation in accordance with the present invention.

FIG. 13 shows the program operation on cell 200 in each embodiment of the present invention. The program operation of memory cells in accordance with the present invention can be done by employing the ICHE or the BTBT mechanisms well-known in the art. Using ICHE mechanism as an example for illustration, the cell 200 is programmed by setting a bias configuration such that $V_S$ is substantially at same or similar voltage level with respect to $V_W$ and is sufficiently more positive with respect to $V_D$. When employing ICHE mechanism, it is desirable to maintain the voltage of CSR ($V_{CSR}$) at a level that is substantially lower than the source voltage by at least a threshold voltage ($V_T$) of the cell 200. For example, when cell is biased with $V_S$=0V, $V_{CSR}$ can be set at −1V for a cell having $V_T$=−0.6V. Such bias configuration forms an inversion layer of holes 58 in the channel 48 and accelerates the holes 58 by a lateral electric field to transport them along a trajectory 59 along the channel 48 toward the drain 46. The holes 58 are energized to generate impacted electrons 60 through impact ionization and a portion of such electrons 60 are injected along a trajectory 95 and introduced onto the CSR 40 and stored thereon. An example on biases for programming the cell is: $V_S$=0V (applied to source 44), $V_W$=0V (applied to n-Well 50), and $V_D$=−3.3V (applied to drain 46). Alternately, another example on biases for programming the cell is: $V_S$=0V, $V_W$=1V, and $V_D$=−3.3V.

For programming cells having a control element (for example, cell 400) or a coupling capacitor (for example, cell 500), the bias configuration can further comprises setting $V_{CG}$ at a voltage sufficiently more negative with respect to $V_S$ to couple sufficient voltage onto CSR 40. An example on $V_{CG}$ for programming the cell is: $V_{CG}$=0V to about −1V.

The memory cells of the present invention is illustrated in storing charges on CSR 40 of a conductive or semiconductor material that is electrically insulated from but capacitively coupled to surrounding conductive regions. In such storage scheme, charges are evenly distributed through out CSR 40. However, it should be apparent to those of ordinary skill in the art having the benefit of this disclosure that the present invention is not limited to the illustrated herein and embodiments described above, but can encompass any other type of schemes for storing charges. For example, the memory cells of the present invention can store charges in CSR comprising a plurality of discrete storage sites such as nano-particles or traps in a dielectric layer.

Figure 14:
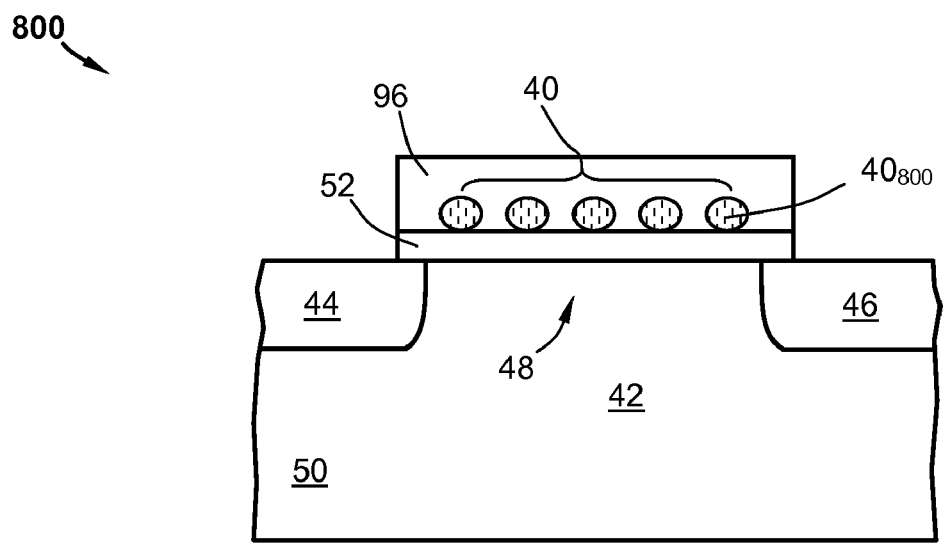
FIG. 14 is a cross-sectional view of a memory cell in accordance with another embodiment of the present invention.

Turning now to FIG. 14, memory cell 800 provides another embodiment on memory cell in accordance with the present invention. The cell 800 is in all respect except one the same as cell 200 of FIG. 2A. The difference is that instead of a conductive region as CSR 40, the cell 200 is provided with a plurality of spaced-apart nano-particles 40$_{800}$ formed in nanometer scale as CSR 40. The nano-particles 40$_{800}$ is typically in an oval shape having a dimension in the range of about 2 nm to about 10 nm, and is shown contacting the channel insulator 52 and formed in an retention insulator 96. The retention insulator 96 is shown in a single layer and can be a layer of a stack of different dielectrics, such as a layer of oxide/nitride/oxide stack. The nano-particles as the storage sites can be silicon nano-crystals each in an oval shape having a diameter in the range of about 2 nm to about 7 nm, and can be formed by using well-known CVD technique. The nano-particles can be other types of semiconductor materials (e.g. Ge, SiGe alloy etc.), dielectric particles (e.g. $HfO_2$), or metals (e.g. Au, Ag, Pt etc.) that are in nano-particles form and can effectively store charges.

It should be clear to those of ordinary skill in the art that the nano-particles 40$_{800}$ need not be in oval shape in their cross section, need not be co-planar with the substrate surface, but rather can be at any level under or above the substrate surface, and with other shape that can effectively store charge carriers. Moreover, the nano-particles need not be contacting the retention insulator 96, need not be fully in the retention insulator 96, but rather can be partially in retention insulator 96 and partially in channel insulator 52, or can be fully in the channel insulator 52.

Figure 15:
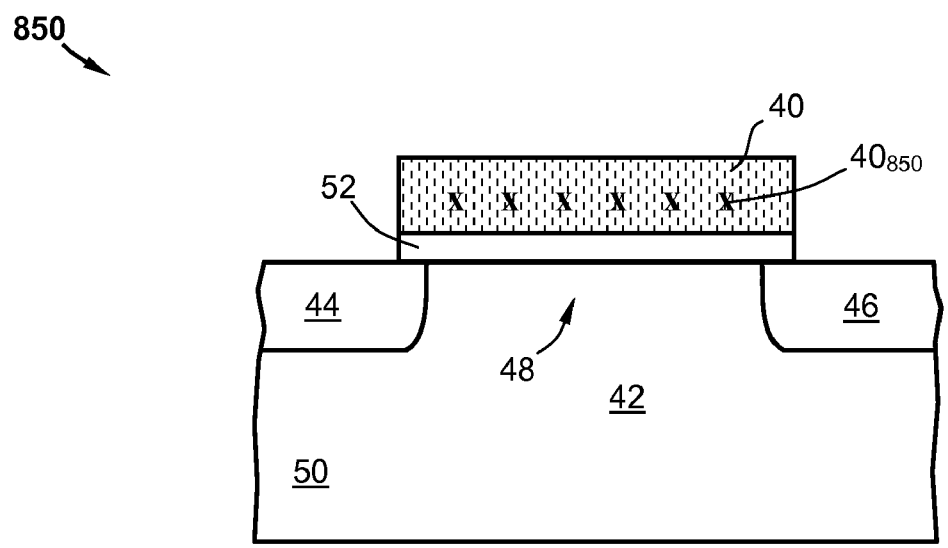
FIG. 15 is a cross-sectional view of a memory cell in accordance with yet another embodiment of the present invention.

FIG. 15 provides cross sectional view on a memory cell 850 of another embodiment on cells in accordance with the present invention. The cell 850 is in all respect except one the same as cell 200 of FIG. 2A. The difference is that instead of a conductive region for CSR 40, the cell 850 provides a CSR 40 of trapping dielectric having a plurality of trapping centers (traps 40$_{850}$). The dielectric CSR 40 uses traps 40$_{850}$ as the charge storage sites and can be a nitride layer formed, for example, by using LPCVD (Low-Pressure-Chemical-Vapor-Deposition) technique well-known in the art. Other dielectrics such as $HfO_2$ and $ZrO_2$ having traps of a deeper trapping energy can also be considered as material for the trapping dielectric.

Both cells 800 and 850 utilize scheme storing charges in localized charge storage sites that are in the form of nanoparticles $40_{800}$ and traps $40_{850}$, respectively. These cells can be erased and programmed in similar way as that illustrated for cell 200 in connection with FIGS. 2B and 13, respectively. The advantages of these two cell structures are reduced process complexity, and a negligible interference between adjacent cells when such types of cells are arranged in a memory array. Furthermore, in the event there is a local breakdown in surrounding insulators of one of the sites, charges stored at other sites can still be retained to preserve logic data stored thereon.

The specifications and dimensions of the cells in accordance with the present inventions are closely related to the design rules of a given generation of process technology. Therefore, the foregoing specifications and dimensions on cells and on regions defined therein are only illustrative examples. In general, however, the specifications and dimensions must be such that secondary hot holes are effectively generated in the body and injected onto CSR at a larger voltage difference between $V_S$ and $V_W$ (e.g. 2.5 V to 5 V). Further, the specifications and dimensions must be such that impacted electrons are effectively generated in the body and injected onto CSR at a smaller voltage difference between $V_S$ and $V_W$ (e.g. 0 V to 1 V).

One of the unique features provided in the erase operation of the present invention is that there is no high voltage across insulators surrounding the CSR 40. These insulators include channel insulator 52 in memory cells in accordance with the present inventions. For example, in the bias configuration illustrated in erasing cell 700, the voltage drop across channel insulator 52 is in the range of about 3 V to about 4 V. This voltage corresponds to a maximum stress field in the insulator at a level of about 3 MV/cm, assuming the insulator is with a thickness of about 100 Å. The voltage drop across the insulator is further lowered as more holes are introduced during or after completing the operation. Therefore, the maximum field through out the erase operation of the present invention is much lower than the stress field typically seen in the prior art when the Fowler-Nordheim mechanism is employed as the erase method.

Figure 16:
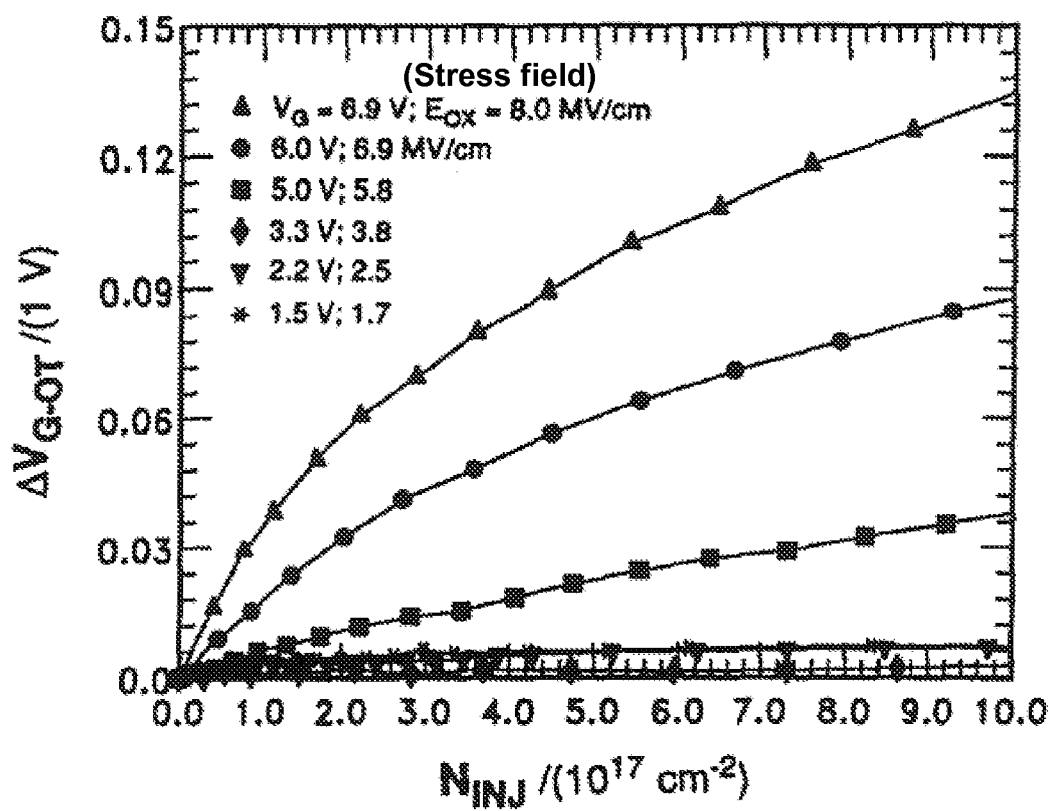
FIG. 16 illustrates the gate voltage shift due to oxide traps for various stress field ($E_{OX}$) applied to the oxide.

The ability on keeping a low stress field on insulators surrounding CSR 40, as provided in the present invention, further provides advantage on suppressing the shift on $V_T$ ($\Delta V_T$). It is well-known that $V_T$ of the memory cell can be shifted from initial level after the cell received enough program and erase cycles. The shift level of $\Delta V_T$ is known sensitive to the stress field across the insulator (see Nishida et al, "Oxide field and thickness dependence of trap generation in 9-30 nm dry and dry/wet/dry oxides", J. Appl. Phys., vol. 69, pp. 3986-3994, 1991.). FIG. 16 illustrates an example on a chart in the noted article. It can be clearly seen that $\Delta V_{G-OT}$ of the vertical axis, which represents $\Delta V_T$, can be significantly reduced to a level below 0.01 V as the stress field across insulator ($E_{ox}$ shown in legend) is confined to a lower range that is below 3 MV/cm. Furthermore, it is illustrated in FIG. 16 that $\Delta V_{G-OT}$ in this lower range of $E_{ox}$ is insensitive to the amount of injected charge carriers ($N_{INJ}$ in the horizontal axis) flowing through the insulator. The present invention takes advantage of this unique phenomenon in oxide physics and implements it in memory cell operation.

Self-Limiting Erase Method on Memory Cell Operation

Description on the self-limiting method of the erase operation and its usage on cell design and cell operation to prevent over-erase issue will now be provided.

During the erase operation of memory cells in accordance with the present invention, as SSHHI continues, the negative charges on CSR are neutralized, and the value of $V_{CSR}$ can increase to a range where the holes in the channel starts disappearing, thus shutting off the SSHHI process itself. This effect provides a self-limiting mechanism to the erase operation of the present invention. This mechanism can prevent CSR from being converted to an unduly positively charged state, thus prevents cells of the present invention from being over-erased from a desired level.

Over-erase issue is well-known in the art. It leads difficulties on programming a p-FET based memory cell when employing ICHE for the operation. For an over-erased p-FET cell, the channel hole current can be so low such that it prohibits the cell from being programmed by using ICHE mechanism (see Chris Diorio, "A p-Channel MOS Synapse Transistor with Self-Convergent Memory Writes," IEEE Trans. Electron Devices, vol. 47, pp. 464-472, 2000). As described in the noted article, the over-erase issue in p-FET based cell can be prevented by employing complicate algorithm to initialize this type of memory cell through trimming cell current to a low level typically in the range of about 100 nA. This algorithm on trimming the cell current is however not required in memory cell of the present invention. Employing the erase condition in cell 700 as an illustration, the SSHHI ends as $V_{CSR}$ is approximately lower than $V_S$ by a $V_T$. Therefore, during the erase operation of the cells of the present invention, the cells start in inversion mode and ends in sub-threshold mode at the end of the erase operation. It is notable that at the end of the self-limiting erase process, the parameters determining $V_{CSR}$ are to do with the voltages applied to electrodes of the memory cell as well as the coupling ratio of the capacitor components of corresponding electrodes. Thus with a choice on a set of these parameters, the present invention allows the memory cells be erased to a state a priori. As a result, the cell never got unduly over-erased. In fact, it can be maintained at a level slightly below the sub-threshold level where cell channel current can be at a level ranging from about 10 pA to about 10 nA. Keeping erased cells at such level of state is important as it permits sufficient channel hole current be supplied for ICHE process when a sufficiently negative $V_{CG}$ is applied to the control gate. Different from the memory cell in the noted article, the present invention does not require special algorithm on cell operation to prevent the unduly over-erase issue.

The method on erase operation provided in the present invention has the advantages on high injection efficiency for the erase carriers, self-limiting feature on erase, and immunity from the unduly over-erase. Moreover, there is no high stress field ever appear to the storage insulator, thus the erase method avoids retention failure caused by the high stress field.

For memory cells in accordance with the present inventions, it should be noted that both program and erase operations can be done with absolute voltage at a level less than or equal to 3.3V.

A preferred embodiment of the present invention is on employing the SSHHI mechanism for the erase operation and the ICHE mechanism for the program operation of the memory cells. The ICHE takes effect as sufficient holes are formed in the channel. Likewise, the SSHHI performs its effect while sufficient holes are in presence in the channel, and ends its effect as holes are nearly disappearing from the channel. The presence of holes in the channel thus ties the two mechanisms, and hence the two operations together. The unique portion of the preferred embodiment is that it provides cell condition at the end of one operation (e.g. erase) be the starting condition for the other operation (e.g. program).

Finally, to read the memory cells of the present invention, a voltage of about +3.3 V can be applied to the source 44. A voltage of approximately +1.8 V is applied to the drain. The body 42 is set at about +3.3 V. Alternately, a voltage of about 0 V can be applied to the source 44 and a voltage of approximately −1.8 V is applied to the drain. The body 42 is set at 0 V. Ground voltage (0V) is applied to the substrate 90. For cells having a control element (for example, cell 400) or a coupling capacitor (for example, cell 500), an additional voltage of about 0 to about −3 V is applied to the control gate 75. If the CSR is negatively charged (i.e. CSR 40 is charged of electrons), then the channel 48 is strongly turned on. Thus, a high electrical current will flow from the source 44 to the drain 46. This would be the "1" state.

On the other hand, if CSR 40 is discharged of electrons, the channel 48 cannot be strongly turned on, and hence the cell is either weakly turned on or is entirely shut off. Even when control gate 75 and drain 46 are biased at the read potential, little or no current will flow through the channel 48 of the memory cell. In this case, either the current is very small compared to that of the "1" state or there is no current at all. In this manner, the memory cell is sensed to be programmed at the "0" state.

Figure 1A:
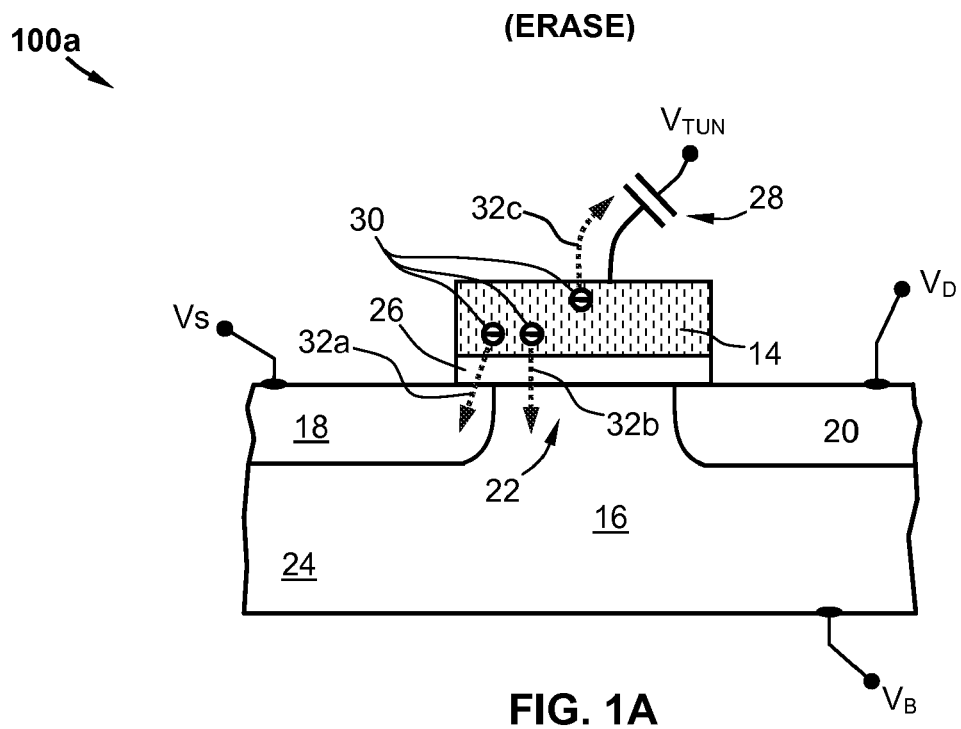
FIG. 1B (prior art) is a cross sectional view illustrating another memory cell architecture of the prior art, and further illustrating the trajectories of the electrons movements in the erase operation.
Figure 1B:
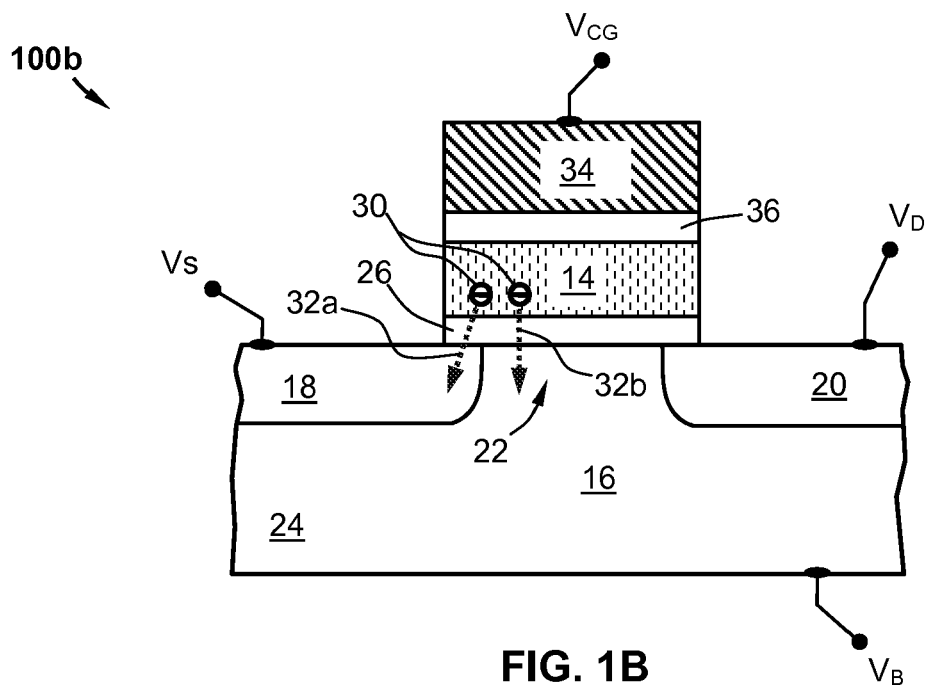
Figure 17A:
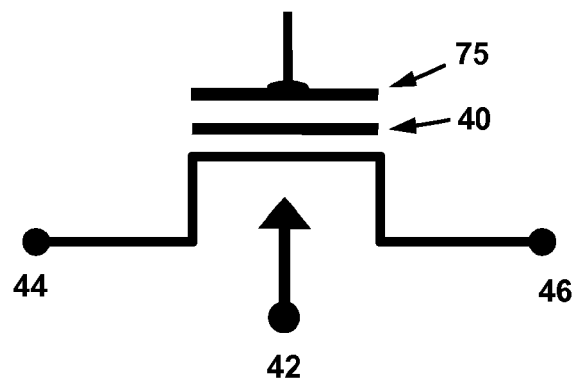
FIG. 17A is a circuit symbol for the memory cell in accordance with the present invention.
Figure 17B:
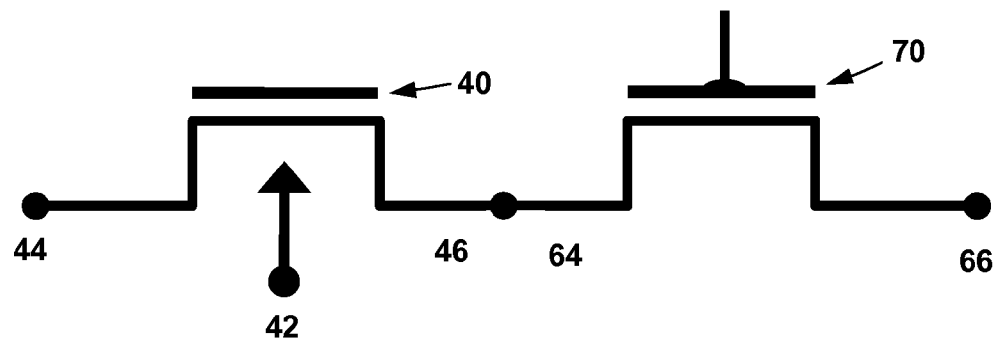
FIG. 17B is a circuit symbol for the memory cell in accordance with another embodiment of the present invention.
Figure 17C:
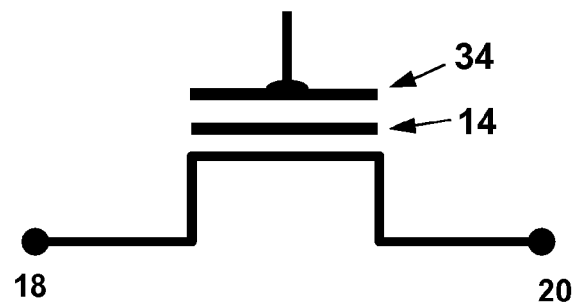
FIG. 17C is a circuit symbol for the memory cell of the prior art.

FIGS. 17A and 17B show the electrical circuit symbols for cells of the present invention having control gate 75 and select gate 70, respectively, wherein the body 42, according to the present invention, suitable for delivering holes to the floating gate of the nonvolatile memory cell is illustrated. FIGS. 17A and 17B further show other elements of the cells including source 44, drain 46, and CSR 40 in the circuit symbol. FIG. 17B further provides other elements including the second source 64 and the second drain 66. In a contrast, the electrical circuit symbol for the prior art cells, and elements including source 18, drain 20, FG 14, and control gate 34, as described in connection with FIG. 1B, are illustrated in FIG. 17C.

The memory cells in accordance with the present invention can be employed to form an electrically erasable and programmable nonvolatile memory device having at least one memory array and peripheral circuitries including conventional row address decoding circuitry, column address decoding circuitry, sense amplifier circuitry, output buffer circuitry and input buffer circuitry, which are well known in the art. Each memory array comprises a plurality of nonvolatile memory cells arranged in a rectangular array of rows and columns. Each of the plurality of nonvolatile memory cells comprises a body of an n-type conductivity in a well of the n-type conductivity, a source and a drain of a p-type conductivity formed in the well with a channel of the body defined therebetween, a charge storage region disposed over and insulated from the channel by a channel insulator, a bias setting having a source voltage applied to the source, a well voltage applied to the well, and a drain voltage applied to the drain, and a bias configuration for an erase operation of the memory cell. The bias configuration is such that source voltage is sufficiently more negative with respect to the well voltage and is sufficiently more positive with respect to the drain voltage to inject hot holes onto the charge storage region.

Figure 18:
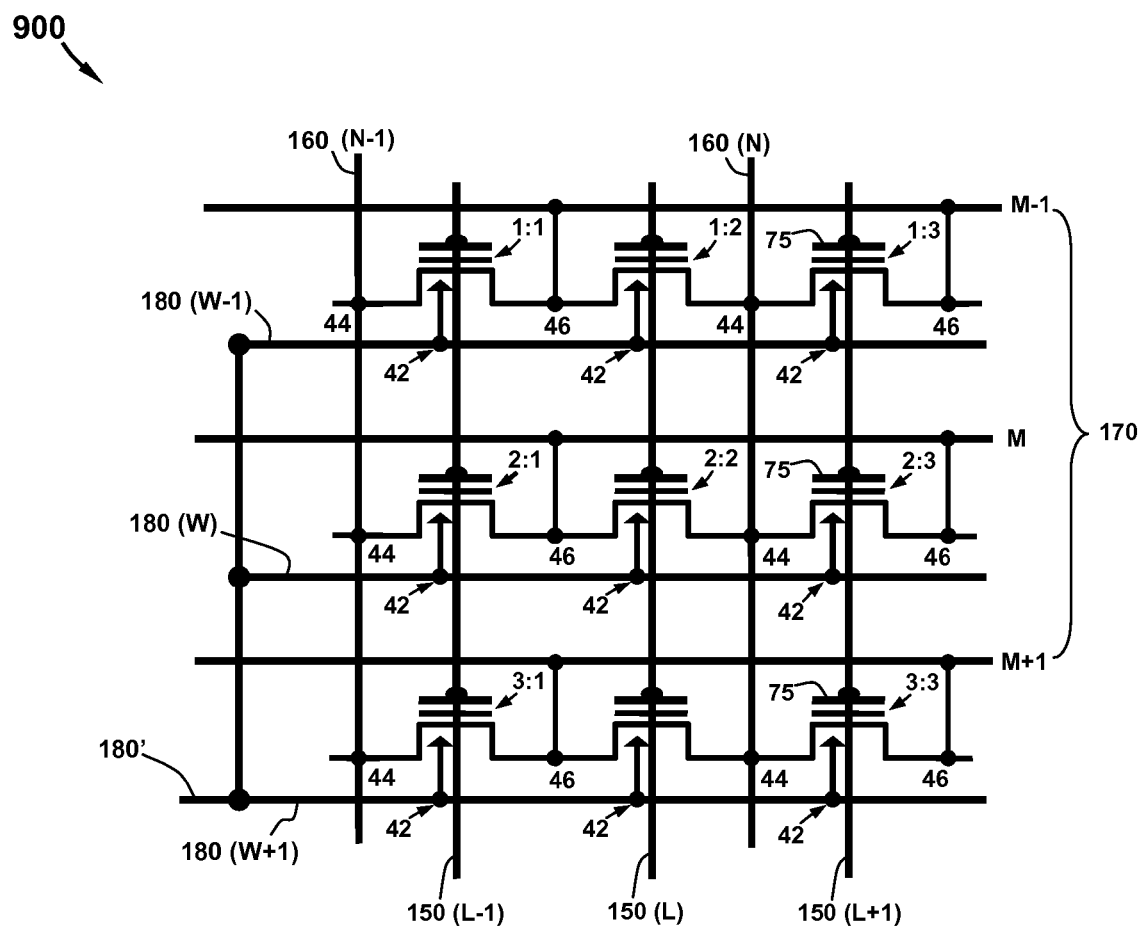
FIG. 18 is a schematic diagram for one embodiment on memory array constructed using memory cells in accordance with the present invention.

FIG. 18 illustrates a portion of a memory array 900 constructed in the circuit symbol of the FIG. 17A type for memory cells in accordance with the present invention. As will be appreciated, reference indicators throughout the drawings are shown only in a few places of identical regions in order not to overcomplicate the drawings. Referring to FIG. 18, wherein a NOR array architecture in schematic diagram having word-lines 150, including word-lines L−1, L, and L+1, and source-lines 160, including source-lines N−1, and N, all oriented in a first direction (column direction). Further, there are shown bit-lines 170, including M−1, M, and M+1, oriented in a second direction (row direction). Each of the word-line 150 is shown connecting all the control gates 75 of memory cells in the same column. For example, the word line L+1 connects the control gates 75 of each of the memory cells in the rightmost column including cells 1:3, 2:3, and 3:3. Each of the bit-lines 170 connects all the drains 46 of memory cells in the same row. For example, the bit-line M−1 connects the drains 46 of each of the memory cells in the uppermost row including cells 1:1, 1:2, and 1:3. Likewise, each of the source-lines 160 connects all the sources 44 of memory cells in the same column. For example, the source-line N−1 connects the sources 44 of each of the memory cells in the leftmost column including cells 1:1, 2:1, and 3:1. Memory cells in one column share a source-line 160 with memory cells in an adjacent column to form a column of multiple pairs of memory cells that mirror each other ("mirror cells"). For example, cells 1:2 and 1:3 forms one pair of mirror cells and cells 2:2 and 2:3 forms another pair of mirror cells that are in the same column as the one pair of mirror cells. Thereby, each pair of mirror cells shares a single source 44 therebetween and has their drains 46 on either side of the mirror cells. One cell of one cell pair of mirror cells in one column and one cell of another cell pair of mirror cells in a same row and in an adjacent column share a single drain 46 therebetween. For example, memory cell 1:1 shares drain 46 with memory cell 1:2.

Although one of each type of lines is shown connecting all the similar regions in same row or column, it should be obvious to those having ordinary skill in the art that one of each type of lines can connect to some of the similar regions in same row or column. For example, word-line L+1 need not connects all the control gates of memory cells in the rightmost column (such as cells 1:3, 2:3 and 3:3) but rather can connect some of the control gates of memory cells in the rightmost column (such as cells 1:3 and 3:3). Likewise, the source-line N−1 need not connect all the sources 44 of the memory cells in the leftmost column but rather can connect some of the sources of memory cells in the leftmost column (e.g. cells 1:1 and 2:1).

The memory array 900 further provides well-lines 180, including well-lines W−1, W, and W+1, oriented in the second direction (row direction). Each of the well-lines 180 is shown connecting all the body 42 of memory cells in the same row. For example, the well-line W−1 connects the body 42 of each of the memory cells in the uppermost row including cells 1:1, 1:2, and 1:3. Although the well-lines 180 are illustrated all oriented in the second direction (row direction), in general, the well-lines can be oriented in other directions or any combination thereof. For example, well-lines can be oriented in the first direction to connect all the body 42 of memory cells in the same column. Some of the well-lines 180 can be connected to form a single well-line. For example, FIG. 18 illustrates the well-line 180' connects a plurality of well-lines W−1, W, and W+1 to form one single well-line 180'.

While array 900 is shown constructed on cell symbol of the FIG. 17A type, such showing is only by way of example, and other cell symbol of the present invention, such as circuit symbol of the FIG. 17B type, can be readily employed with proper changes made in connecting the word-lines and bit lines. Please refer to array 910 of FIG. 19 for such illustration. The array 910 is constructed on symbol of the FIG. 17B type. Different from the array 900, the array 910 is constructed with proper changes made on word-lines 150 and bit-lines 170. As illustrated, each word-line now connects all the select gates 70 of cells in the same column. For example, the word line L+1 connects the select gates 70 of each of the memory cells in the rightmost column including cells 1:3, 2:3, and 3:3.

Likewise, each bit-line connects all the second drain 66 of memory cells in the same row. For example, the bit-line M–1 connects the second drains 66 of each of the memory cells in the uppermost row including cells 1:1, 1:2, and 1:3.

Those of skill in the art will recognize that the term source and drain may be interchanged, and the term source and drain lines or source and bit lines may be interchanged. Further, in some embodiments, the word line is connected to the control gate of the memory cell. Thus, the term control gate, or control gate line may also be used interchangeably with the term word line. Moreover, in some embodiments the word line is connected to the select gate of the memory cell. Thus, the term select gate, or select gate line may also be used interchangeably with the term word line.

The erase operation of the array thus constructed can be done in a small group of such cells (e.g. cells storing a digital word, which contains 8 cells) for byte erase. Additionally, the erase can be done in large group of cells (e.g. cells storing code for software program, which can contains 2048 cells configured in page, or contains a plurality of pages in block in the array architecture).

Figure 19:
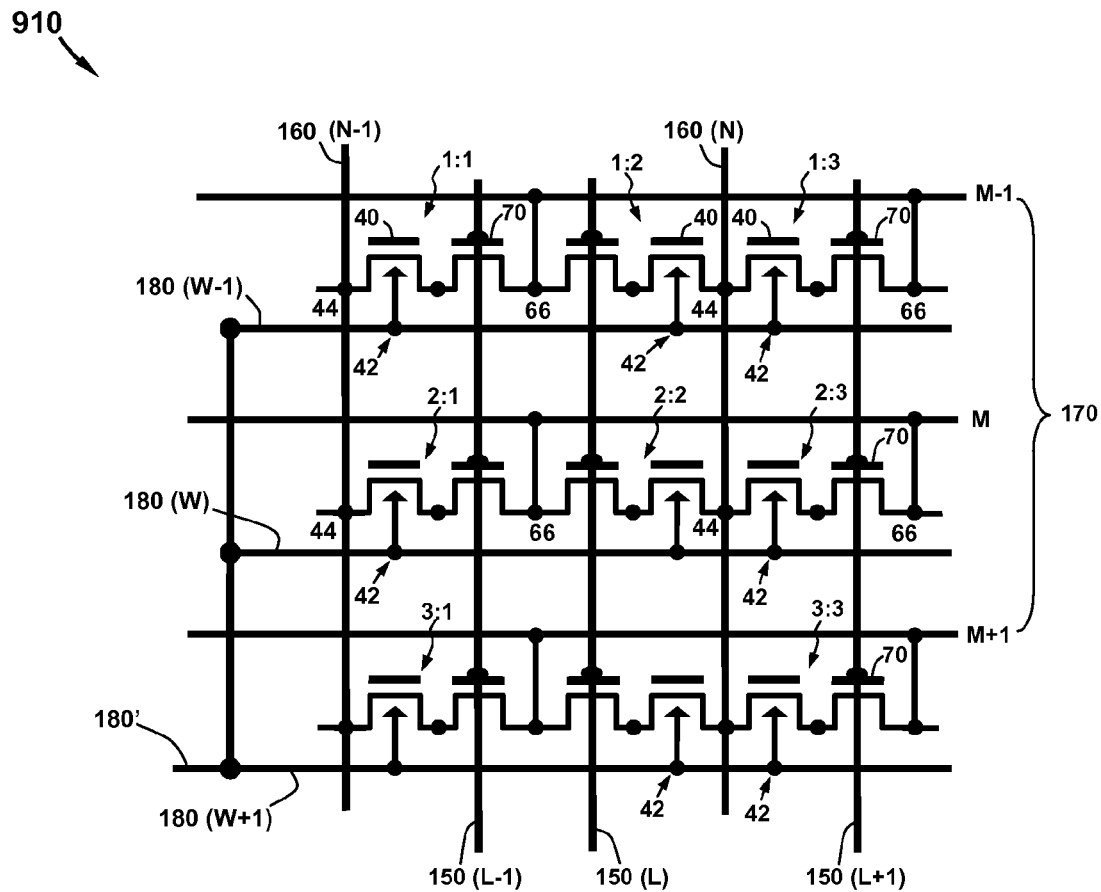
FIG. 19 is a schematic diagram for another embodiment on memory array constructed using memory cells in accordance with the present invention.

The NOR arrays shown in FIGS. 18 and 19 are array architectures used as an example to illustrate the array formation using memory cells of the present invention. It should be appreciated that while only a small segment of array region is shown, the examples in FIG. 18 and in FIG. 19 illustrate any size of array of such regions. Additionally, the memory cells of the present invention can be applied to other types of NOR array architecture. For example, a memory array wherein cells on each column have their own dedicated source line. Furthermore, although the present invention is illustrated in a single cell and in a NOR array, it should be apparent to those of ordinary skill in the art that a plurality of cells of the present invention can be arranged in a rectangular array of rows and columns, wherein the plurality of cells are constructed in AND or NAND array architecture well-known in the art or any combination thereof (e.g. a NAND and a NOR array structure).

It is to be understood that the present invention is not limited to the illustrated herein and embodiments described above, but encompasses any and all variations falling within the scope of the appended claims. For example, although the present invention is illustrated in memory cell programmed with ICHE, it should be apparent to those having ordinary skill in the art that it can be extended to any other type of mechanism for programming the memory cell of the present invention (such as Drain-Avalanche Hot-Carrier Injection, or BTBT injection mechanism). Further, although the cell of present invention is erased by employing the Secondary Substrate Hot Hole Injection (SSHHI) mechanism, it should be apparent to those having ordinary skill in the art that any other type of mechanisms that can generate substrate hot holes and can transport the hot holes along a direction perpendicular to the channel surface can be readily employed for erasing the cell. Such mechanism can be the Substrate Hot Holes Injection mechanism with holes provided by a forward biased p-n diode, such as the p-n diode comprised of the p-sub 72 and n-Well 50.

Moreover, the charge storage region of the present invention need not be in rectangular shape in their top view, need not be in rectangular shape in their cross-sections, but rather can be any size and shape in their top view and in their cross-sections that effectively store charges and effectively connects the drain and source regions of each memory cell. Likewise, the source and drain regions need not be in rectangular shape in their top view, need not be in rectangular in their cross-sections, but rather can be any size and shape in their top view and cross-sections. Similarly, the control gate need not be in rectangular shape in their top view, need not be in rectangular shape in their cross-sections, need not be disposed atop of the charge storage region, but rather can be any size and shape in their top view and cross-sections, placed in any location that effectively coupled with the charge storage region. Additionally, the top surface portion of the storage region need not be above the substrate surface, but rather can be at any level under or above the substrate surface that permit the storage region to effectively store charges, effectively coupled with the body, and effectively connects the drain and source regions in each memory cell. Similarly, the bottom surface portion of the storage region need not be parallel to the substrate surface, need not be flat, but rather can be with other shape that permit storage region to effectively store charges, effectively coupled with the body, and effectively connects the drain and source regions of each memory cell. Additionally, the surface of the channel region need not be co-planar with the substrate surface, but rather can be at any level under or above the substrate surface or in any angle with the substrate surface that effectively connects the drain and source regions of each memory cell. Moreover, source and drain regions, and source lines and bit lines, can be swapped. It should be understood that while the figures show the substrate uniformly doped, it is well known that any and/or all of the regions formed therein (source, drain, channel region, body region, etc.) can be formed in one or more well regions (of differently doped silicon).

What is claimed is:

1. An electrically erasable and programmable nonvolatile memory device including at least one memory cell, each memory cell comprising:
   a body of n-type conductivity in a well of n-type conductivity;
   a source and a drain of p-type conductivity formed in the well with a channel of the body defined therebetween;
   a charge storage region disposed over and insulated from the channel by a channel insulator;
   a source electrode having a source voltage applied to the source, a well electrode having a well voltage applied to the well, and a drain electrode having a drain voltage applied to the drain;
   wherein the source voltage is sufficiently more negative with respect to the well voltage and is sufficiently more positive with respect to the drain voltage for an operation of the memory cell.

2. The memory device of claim 1, wherein the charge storage region of each memory cell comprises material selected from the group consisting of n+ or p+ polysilicon, n+ or p+ poly SiGe, Al, Pt, Au, Ti, W, Mo, Ru, Ta, Ni, Co, TaN, TiN, PtSi, TiSi, WSi, NiSi, CoSi, and any alloy thereof.

3. The memory device of claim 1, wherein the charge storage region of each memory cell comprises a trapping dielectric having a plurality of trapping centers.

4. The memory device of claim 1, wherein the charge storage region of each memory cell comprises an insulator having a plurality of spaced-apart nano-particles.

5. The memory device of claim 1, wherein the channel insulator of each memory cell comprises material selected from the group consisting of oxide, nitride, oxynitride, $Al_2O_3$, $HfO_2$, $TiO_2$, $ZrO_2$, $Ta_2O_5$, and any alloy formed thereof.

6. The memory device of claim 1, each memory cell further comprising:
   the source voltage being substantially the same as the well voltage and being sufficiently more positive with respect to the drain voltage for another operation of the memory cell.

7. The memory device of claim 6, wherein the source voltage, the well voltage and the drain voltage are always low voltages.

8. The memory device of claim 7, wherein the low voltages have absolute values less than or equal to approximately 3.3V.

9. The memory device of claim 1, each memory cell further comprising:
a control gate of conductive material disposed over and insulated from the charge storage region by a coupling insulator;
and a control gate electrode having a control gate voltage applied to the control gate,
wherein the control gate voltage is sufficiently more negative with respect to the source voltage so as to enhance the operation of the memory cell.

10. The memory device of claim 9, each memory cell further comprising:
another operation of the memory cell;
wherein the control gate voltage is sufficiently more negative with respect to the source voltage, and the source voltage is substantially the same as the well voltage and is sufficiently more positive with respect to the drain voltage to inject impacted electrons onto the charge storage region.

11. The memory device of claim 10, wherein the source voltage, the well voltage, the drain voltage and the control gate voltage are always low voltages.

12. The memory device of claim 11, wherein the low voltages have absolute values less than or equal to approximately 3.3V.

13. The memory device of claim 1, wherein each memory cell provides a self-limiting mechanism to prevent hot holes from being over injected onto the charge storage region, thereby preventing over-erase of the memory cell.

14. An electrically erasable and programmable nonvolatile memory device including at least one memory array, each memory array comprising a plurality of nonvolatile memory cells arranged in a rectangular array of rows and columns, each of the plurality of nonvolatile memory cells comprising:
a body of n-type conductivity in a well of n-type conductivity;
a source and a drain of p-type conductivity formed in the well with a channel of the body defined therebetween;
a charge storage region disposed over and insulated from the channel by a channel insulator;
a source electrode having a source voltage applied to the source, a well electrode having a well voltage applied to the well, and a drain electrode having a drain voltage applied to the drain;
wherein the source voltage is sufficiently more negative with respect to the well voltage and is sufficiently more positive with respect to the drain voltage for an operation of the memory cell.

15. The memory device of claim 14, each of the plurality of nonvolatile memory cells further comprising a control gate; and each memory array further comprising:
a plurality of word-lines oriented in a first direction;
a plurality of source-lines oriented in a first direction;
a plurality of bit-lines oriented in a second direction; and
a plurality of well-lines;
wherein each of the word-lines connects the control gates of some of the memory cells, each of the source-lines connects the sources of some of the memory cells, each of the bit-lines connects the drains of some of the memory cells, and each of the well-lines connects the bodies of some of the memory cells.

16. The memory device of claim 14, wherein the plurality of nonvolatile memory cells are formed as pairs of memory cells having each of the memory cell pairs sharing a single source therebetween.

* * * * *